(12) United States Patent
Jennings, III et al.

(10) Patent No.: US 7,284,027 B2
(45) Date of Patent: Oct. 16, 2007

(54) METHOD AND APPARATUS FOR HIGH SPEED CALCULATION OF NON-LINEAR FUNCTIONS AND NETWORKS USING NON-LINEAR FUNCTION CALCULATIONS FOR DIGITAL SIGNAL PROCESSING

(75) Inventors: Earle Willis Jennings, III, Kensington, CA (US); George Landers, Mountain View, CA (US)

(73) Assignee: QSigma, Inc., San Jose, CA (US)

( * ) Notice: Subject to any disclaimer, the term of this patent is extended or adjusted under 35 U.S.C. 154(b) by 638 days.

(21) Appl. No.: 10/226,735

(22) Filed: Aug. 22, 2002

(65) Prior Publication Data

US 2003/0041083 A1  Feb. 27, 2003

Related U.S. Application Data

(63) Continuation-in-part of application No. 10/155,502, filed on May 23, 2002, now abandoned, and a continuation-in-part of application No. PCT/US01/15541, filed on May 14, 2001.

(60) Provisional application No. 60/215,894, filed on Jul. 5, 2000, provisional application No. 60/217,353, filed on Jul. 11, 2000, provisional application No. 60/231,873, filed on Sep. 12, 2000, provisional application No. 60/261,066, filed on Jan. 11, 2001, provisional application No. 60/282,093, filed on Apr. 6, 2001, provisional application No. 60/314,411, filed on Aug. 22, 2001, provisional application No. 60/325,093, filed on Sep. 25, 2001, provisional application No. 60/365,416, filed on Mar. 18, 2002, provisional application No. 60/402,346, filed on Aug. 9, 2002, provisional application No. 60/204,113, filed on May 15, 2000.

(51) Int. Cl.
*G06F 7/52* (2006.01)

(52) U.S. Cl. .................................... 708/622; 708/404
(58) Field of Classification Search ................ 708/277, 708/517, 512, 622
See application file for complete search history.

(56) References Cited

U.S. PATENT DOCUMENTS 4,078,250 A * 3/1978 Windsor et al. ............ 708/204

(Continued)

FOREIGN PATENT DOCUMENTS

WO          WO92/01981 A1        2/1992

(Continued)

OTHER PUBLICATIONS

Albert Liddicoat, et al, "High-Performance Floating Point Divide", 8 pages.

(Continued)

*Primary Examiner*—Tan V. Mai
(74) *Attorney, Agent, or Firm*—Earle Jennings

(57) ABSTRACT

The invention includes apparatus and methods for high-speed calculation of non-linear functions based upon a shifted adder and a offset generator. Various implementations may preferably include a input preprocessor and/or an output post processor. The invention includes a family of core cells built from instances of these calculators providing an upward, functionally compatible, extension to a family of Application Specific Integrated Circuit (ASIC) core cells. All of these core cells consistently provide the ability to perform high speed DSP tasks including Fast Fourier Transforms (FFTs), Finite Impulse Response (FIR) filters and Infinite Impulse Response (IIR) filters. The core cells built from the calculators can concurrently perform many non-linear function calculations. The core cells can switch between tasks every clock cycle.

43 Claims, 22 Drawing Sheets

U.S. PATENT DOCUMENTS

| | | | | |
|---|---|---|---|---|
| 4,117,538 | A | * | 9/1978 | Shrader et al. ............... 342/91 |
| 4,747,067 | A | * | 5/1988 | Jagodnik et al. ............ 708/517 |
| 6,055,556 | A | * | 4/2000 | Barak et al. ................ 708/607 |

FOREIGN PATENT DOCUMENTS

| | | |
|---|---|---|
| WO | WO93/20502 A1 | 10/1993 |
| WO | WO94/14245 A1 | 6/1994 |
| WO | WO95/33308 A1 | 12/1995 |
| WO | WO96/24094 A1 | 8/1996 |
| WO | WO96/24096 A1 | 8/1996 |
| WO | WO96/24097 A1 | 8/1996 |
| WO | WO96/26478 A1 | 8/1996 |
| WO | WO99/09466 A1 | 2/1999 |

OTHER PUBLICATIONS

Richard Maenner, "A Fast Integer Binary Logarithm of Large Arguments", IEEE, Dec. 1987, 0272-1732, pp. 41-45.

Olli Vanio & Yrjo Neuvo, "Logarithmic Arithmetic in FIR Filters", IEEE, 1986, 0098-4094/86/0800-0826, 2 pages.

David Lewis, "114 MFLOPS Logarithmic Number System Arithmetic Unit for DSP Applications", ISSCC 95, WP5.5, 3 pages.

Mark Arnold, et al, "A Single-multiplier quadratic interpolator for LNS Arithmetic", 6 pages.

Reto Zimmermann, "Lecture Notes on Computer Arithmetic: Principles, Architectures, and VLSI Design", Mar. 16, 1999, Integrated Systems Laboratory, 26 pages.

Altera, "HammerCores by Altera: Logarithm Function", Apr. 2000, 3 pages.

Altera, "HammerCores by Altera: Cordic Functions CDPP and CDPS", Jan. 2000, 8 pages.

Altera, "HammerCores by Altera: Arctan Function", Jan. 2000, 2 pages.

Hossam Fahmy, et al, "Improving the Effectiveness of Floating Point Arithmetic", 2001, 5 pages.

David Russinoff, "A Mechanically checked proof of correctness of the AMD K5 Floating Point square root microcode", Sep. 29, 1997, 50 pages.

Dean Batten, et al, "A Newe approach to DSP Intrinsic Functions", 10 pages.

Dean Batten, et al, "Interactions between optimizations and a new type of DSP intrinsic function", 6 pages.

Jean-Michel Muller, et. al., "Semi-Logarithmic Number Systems", IEEE Transactions on Computers, vol. 47, No. 2, Feb. 1998, pp. 145-151.

Milos Ercegovac, et al, "Reciprication, Square Rott, Inverse Square Root, & some elementary functions using small multipliers", IEEE Transaction on Computers, vol. 49, No. 7, Jul. 2000, pp. 628-637.

Milos Ercegovac, et al, "Improving Goldschmidt Division, Square Root, and Square Root Reciprocal" IEEE Transactions on Computers, vol. 49 No. 7, Jul. 2000, pp. 759-763.

E. Savas, et al, "The montgonery modular inverse-revisited", IEEE Transactions on Computers, vol. 49 No. 7, Jul. 2000, pp. 763-766.

James Stine, et al, "A combined interval and floating point divider", 5 pages.

Albert Liddicoat, et al, "Pipeline-able Division Unit", Stanford Technical Report CSL-TR-00-809, Sep. 2000, 38 pages.

Albert Austin Liddicoat, "High Performance Arithmetic for Division and the Elementary Functions", PhD Dissertation, Feb. 2002, 157 pp.

Javier Hornigo, et al, "A Hardware Algorithm for Varaible-Precision Logarithm", pp. 10 pages.

Robert McIlhenny, et al, "On the implementation of a three-operand muiltiplier", 5 pages.

Vincent Lefevre, et al, Toward Corretly Rounded Transcendentals. IEEE Transactions on Computers, vol. 47 No. 11, Nov. 1998, pp. 1235-1243.

Kent Wires, et al, "Efficient second order approximations for reciprocals and square roots", 9 pages.

Guillaume Hanrot, et al, "Some notes for a proposal for elementary function implementation in floating-point arithmetic", Jun. 8, 2001, 9 pages.

Milos Ercegovac, et al, "Improving Goldschmidt division, square root and square root reciprocal", RR-3763, Sep. 1999, INRIA, ISSN 0249-6399, 23 pages.

Laurent Imbert, et al, "Radix-10 BKM Algorithm for Computing Transcendentals on Pocket Computers" Sep. 1999, RR-3754, ISSN 0249-6399, 15 pages.

Vincent Lefevre, et al, "Worst case for correct rounding of the elementary functions in double precision", RR-4044, Nov. 2000, INRIA, ISSN 0249-6399, 22 pages.

David Defour, et al, "Correctly Rounded Exponential Function in Double Precision Arithmetic", RR-4231, Jul. 2001, ISSN 0249-6399, 33 pages.

Jean-Michel Muller, "Partially rounded small-order approximations for accurate, hardware-oriented, table based methods", Oct. 2002, RR-4593, INRIA, ISSN 0249-6399, 20 pages.

Michael Schulte, et al, "High-speed inverse square roots", 8 pages.

Michel Schulte, et al, "Approximating elementary functions with symmetric bipartite tables", IEEE Transactions on Computers, vol. 48 No. 8, Aug. 1999, pp. 842-847.

Stuart Oberman, et al, "Implementing Division and Other floating-point operations: A system prespective", 7 pages.

Eric Schwarz, et al, "Using a floating-point multiplier's internals for high-radix division and square root", Jan. 1993, Stanford Technical Repot CSL-TR-93-554, 53 pages.

David Harris, et al, "SRT division architectures and implementations", 8 pages.

James Stine, et al, "The symmetric table addition method for accurate function approximation", 1999, Journal of VLSI Signal Processing, pp. 1-12.

Fred Taylor, et al, "A 20 Bit Logairhmic Number System Processor", IEEE Transactions on Computers, vol. 37, No. 2, Feb. 1988, pp. 190-200.

Vitit Kantbutra, "On hardware for computing exponential and trigonometric functions", IEEE Transactions on Computers, vol. 45, No. 3, Mar. 1996, pp. 328-339.

Thanos Stouraitis, et al, "Floating-point to logarithmic encoder error analysis", IEEE transactions on computers, vol. 37, No. 7, Jul. 1988, pp. 858-863.

Michael Schulte, et al, "Hardware designs for exactly rounded elementary functions" IEEE Transactions on Computers, vol. 43, No. 8, Aug. 1994, pp. 964-973.

Mark Arnold, et al, "Applying Features of IEEE 754 to Sign/ Logarithm Arithmetic", IEEE Transactions on Computers, vol. 41, No. 8, Aug. 1992, pp. 1040-1050.

Mark Arnold, et al, "Redundant Logarithmic Arithmetic", IEEE Transactions on Computers, vol. 39, No. 8, Aug. 1990, pp. 1077-1086.

Naofumi Takagi, "Powering by a table look-up and a multiplication with operand modification", IEEE Transactions on Computers, vol. 47, No. 11, Nov. 1998, pp. 1216-1222.

Demetrios Kostopoulos, "An algorithm for the computation of binary logarithms", IEEE Transactions on Computers, vol. 40, No. 11, Nov. 1991, pp. 1267-1270.

Eric Scharz, et al, "Hardware starting approximation method and its application to the square root operation", IEEE Transactions on computers, vol. 45, No. 12, Dec. 1996, pp. 1356-1369.

Javier Hormigo, et al, "A Hardware algorithm for variable-precision division", 8 pages.

Mark Arnold, "Design of a faithful LNS Interpolator", 10 pages.

* cited by examiner

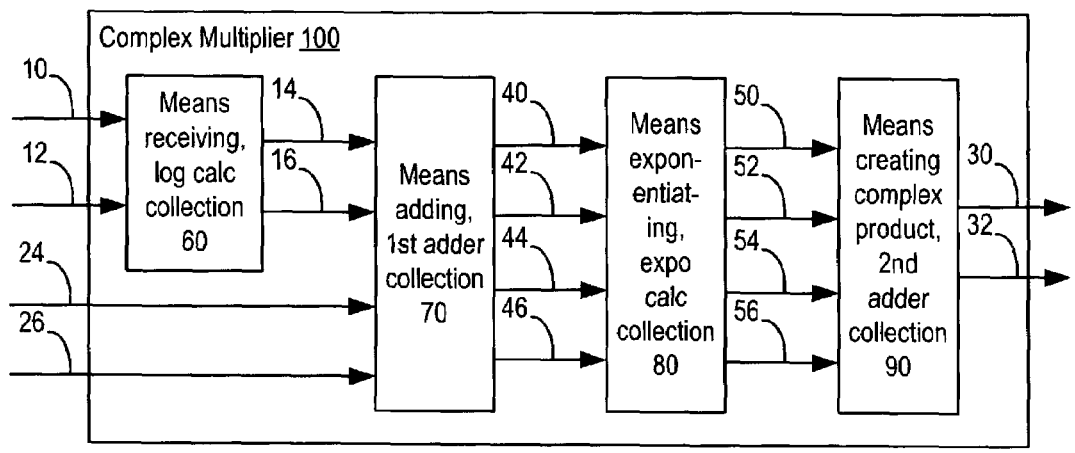
Fig. 4A
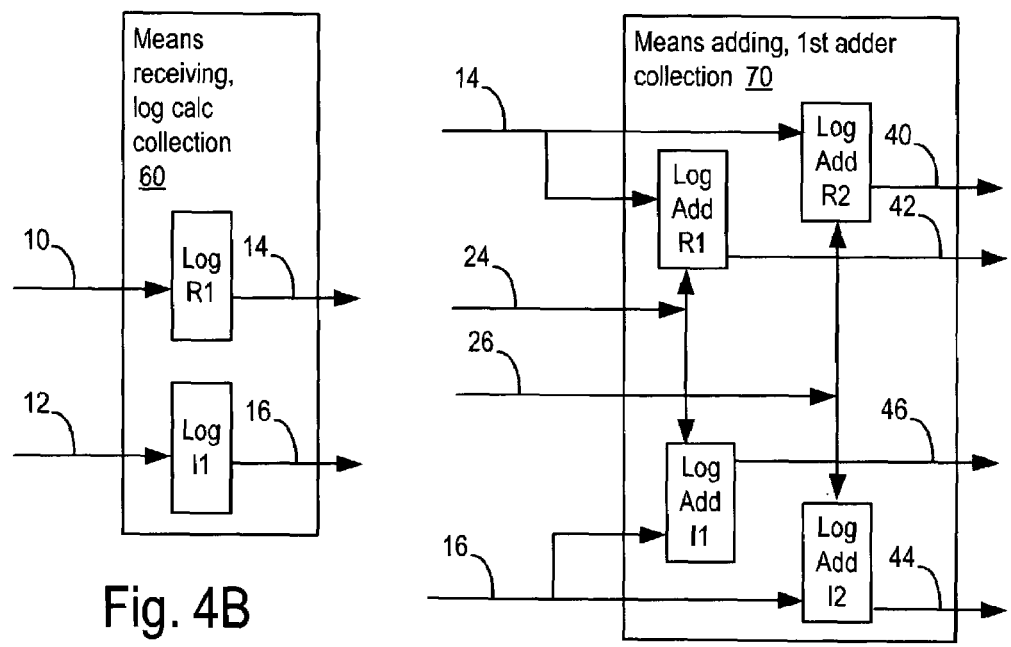
Fig. 4B
Fig. 4C

METHOD AND APPARATUS FOR HIGH SPEED CALCULATION OF NON-LINEAR FUNCTIONS AND NETWORKS USING NON-LINEAR FUNCTION CALCULATIONS FOR DIGITAL SIGNAL PROCESSING

CROSS REFERENCES TO RELATED APPLICATIONS

This application is related to the following provisional applications filed with the United States Patent and Trademark Office:

Ser. No. 60/204,113, entitled "Method and apparatus of a digital arithmetic and memory circuit with coupled control system and arrays thereof", filed May 15, 2000 by Jennings, docket number ARITH001PR;

Ser. No. 60/215,894, entitled "Method and apparatus of a digital arithmetic and memory circuit with coupled control system and arrays thereof", filed Jul. 5, 2000 by Jennings, docket number ARITH002PR;

Ser. No. 60/217,353, entitled "Method and apparatus of a digital arithmetic and memory circuit with coupled control system and arrays thereof", filed Jul. 11, 2000 by Jennings, docket number ARITH003PR;

Ser. No. 60/231,873, entitled "Method and apparatus of a digital arithmetic and memory circuit with coupled control system and arrays thereof", filed Sep. 12, 2000 by Jennings, docket number ARITH004PR;

Ser. No. 60/261,066, entitled "Method and apparatus of a DSP resource circuit", filed Jan. 11, 2001 by Jennings, docket number ARITH005PR; and Ser. No. 60/282,093, entitled "Method and apparatus of a DSP resource circuit", filed Apr. 6, 2001 by Jennings, docket number ARITH006PR.

This application claims priority from the following provisional applications filed with the United States Patent and Trademark Office:

Ser. No. 60/314,411, entitled "Method and apparatus for high speed calculation of non-linear functions", filed Aug. 22, 2001 by Jennings, docket number ARITH007PR;

Ser. No. 60/325,093, entitled "A 64 point FFT Engine", filed Sep. 25, 2001 by Jennings, docket number ARITH008PR;

Ser. No. 60/365,416, entitled "Methods and apparatus compiling non-linear functions, matrices and instruction memories and the apparatus resulting therefrom", filed Mar. 18, 2002 by Jennings and Landers, docket number ARITH010PR; and Ser. No. 60/402,346, entitled "Method and apparatus providing time division multiplexed arithmetic resources for digital signal processing and emulation of instruction memories", filed Aug. 9, 2002 by Jennings and Landers, docket number ARITH011PR.

This application claims priority as a continuation in part from the following application filed with the United States Patent and Trademark Office:

Ser. No. PCT/US 01/15,541, entitled "Method and apparatus of DSP resource allocation and use", filed May 14, 2001 by Jennings, docket number ARITH001; and Ser. No. 10/155,502, entitled "Method and apparatus emulating read only memories with combinatorial logic networks, methods and apparatus generating read only memory emulator combinatorial logic networks", filed May 23, 2002 now abandoned by Landers and Jennings.

TECHNICAL FIELD

This invention relates to non-linear function calculation and instruction processing as applied to Digital Signal Processing (DSP).

BACKGROUND OF INVENTION

Digital Signal Processing (DSP) is one of the most widely used digital technologies today. It is at the heart of audio and image compression innovations which have, and are, rapidly changing the world we live in. While the basic approach has been very successful, there are several problems the inventors have found to significantly limit use of its advantages.

FIG. 1A illustrates a simplified block diagram of a DSP system applicable to cellular base station, medical imaging and instrumentation system applications as found in the prior art.

In FIG. 1A, sensors 1 and 2 provide samples 10 and 12 to DSP Processor, which after performing one or more DSP tasks, generates DSP results. The samples and results are usually in the form of words composed of bits, and are often treated as numbers by DSP processors. The invention is focused on numerical processing, and from hereon, the discussion will assume that the samples and results are to be treated as numbers. The DSP Processor today is typically controlled by an internal processor clock. The sensors typically sample on a regular basis, which will be referred to herein as the sampling rate.

There is a large disparity today between processor clock rates and sensor sampling rates. Often sensors only generate between 20 million and 64 million samples per second, while the clock frequencies of processors are often between 300 and 1000 MHz. While DSP processors can run this fast, there are serious questions as to how to feed enough data into these engines to justify these clock speeds.

DSP Processors can typically perform one or more numeric operations such as adds/subtracts, multiplies and shifts per instruction cycle. A shift of a word of bits moves the bits up or down, effecting division or multiplication by powers of two.

The time between from the receipt of the last sample of a signal or message until the start (sometimes the end) of receiving the result is referred to as latency. Continuous processing means that samples enter the DSP processor continuous. In a clocked system, this means at least one sample enters the system during every clock cycle.

In many cellular base station, medical imaging and instrumentation system applications, there are excellent reasons to treat samples 10 and 12 as a single complex number. A complex number is composed of two numeric components, one called the real numeric component and the other the imaginary numeric component. The mathematical extension of numeric multiplication is called complex multiplication.

A complex number A1 will include a real component A1R 10 and an imaginary component A1I 12 and be denoted by A1=A1R+j A1I, where j refers to the square root of −1. A second complex number A2=A2R+j A2I. Complex multiplication of A1 by A2 gives a complex number with a real component of A1R*A2R−A1I*A2I and an imaginary component of A1R*A2I+A1I*A2R.

FIG. 1B illustrates a prior art complex multiplier multiplying A1 by A2 including four multipliers Mult RR, Mult RI, Mult IR and Mult II and two adders.

There are a number of common DSP tasks, which will be referred to throughout this patent application and to which the invention offers advantages. Many of these tasks are best seen as linear transformations from an input sample vector to a result vector. A vector is an ordered sequence of numbers, which may also be complex numbers.

A linear transformation acts upon an input sample vector by performing adds/subtracts, and multiplications on the numbers in the sample vector to generate the result vector. Examples of linear transformations include Fast Fourier Transforms (FFTs), Discrete Cosine Transforms (DCTs), Discrete Wavelet Transforms (DWT), Finite Impulse Response (FIR) filters and Infinite Impulse Response (IIR) filters.

Each of these linear transformations can be defined in terms of a matrix operating upon the sample vector to generate the result vector. FFTs and DCT's tend to be used on sample vectors containing a finite length sequence of samples. DWT's, FIR's, and IIR's operate on sample vectors of unlimited length. However, the matrices that define these linear transformations are finite in size, possessing a finite number of row and a finite number of columns, with a numeric entry at each row and column. The numeric entries are the coefficients, the A2R's by which the samples A1R are multiplied, with the products then summed to form the result vector components.

FFT's are extremely important. Typically, Fast Fourier Transform implementations focus on complex sample vectors whose sequence length is a power of two, such as 16 to 4,096, generating result vectors of the same sequence length as the sample vector. Without some of the amazing properties of the FFT matrix, computing an FFT of 64 complex samples, also known as points, would require up to 64 complex multiplications, and then summing those complex products to generate each of the complex vector results.

Matrix arithmetic, as with regular arithmetic, supports multiplicative inverses and factors, in the case of the FFT matrices. For a given $2^N$ point complex FFT matrix, the inventors are aware of four distinct factoring products that equal the FFT matrix. One of these is known as the Cooley-Tukey Factorization in honor of the two individuals credited with its discovery. While the other three methods of factoring the FFT are valid and important, the discussion from hereon will focus exclusively on the Cooley-Tukey. This decision is not meant to imply any limitation to the scope of the claims, but is done only for the sake of keeping the discussion as simple as possible. The Cooley-Tukey Factorization for an FFT matrix is a collection of Radix 2 matrices, often called steps, which are performed in a specific sequence, the first acting upon the sample vector, generating a first result vector. The second Radix 2 matrix acts upon the first result vector to generate a second result vector, and so on until the last factor's result vector is essentially the same as the result vector of the FFT matrix acting upon the sample vector. These Radix 2 steps involve no more than two complex multiplications of an input to calculate the effect of that complex input on the complex components of the result vector. As used herein, a Radix operation will refer to the actions necessary to modify the current complex values of a result vector for a given complex input, which for the sake of consistency will be called the complex input A1.

Two adjacent Radix 2 steps in that sequence can be merged to form a Radix 4 step. Three adjacent Radix 2 steps in that sequence can be merged to form a Radix 8 step, and so on. The radix operation of a Radix 4 step will modify four complex components of the result vector for each complex input A1 of that steps's input vector. The radix operation of a Radix 8 step will modify eight complex components of the result vector for each complex input A1 of that step's input vector.

The last several hundred years have seen the emergence of the modern physical sciences and engineering as we know it today. That emergence has been fundamentally aided by the use and availability of a collection of non-linear functions and operations. The most common of these arithmetic tools of technology include division, square root, logarithms, exponentiation, sine and cosine.

These operations became the standard functions of the early scientific calculators, known as slide rules. Slide rules were in widespread use for the last several hundred years until the production of portable digital calculators, which replaced them as the tool of choice among scientists and engineers. These scientific calculators also incorporated at least this basic list of functions.

The following disclosure will make use of some basic facts regarding logarithms and exponentiation and their application to simplify the calculation of division and square roots in particular. Denote the logarithm of A1R by Log A1R, and the logarithm of A2R by Log A2R. The logarithm of the product of A1R and A2R, Log A1RA2R, is the sum of Log A1R and Log A2R. Exponentiation of Log X results in X.

FIG. 1C illustrates multiplier Mult RR of FIG. 1B, containing two log calculators receiving A1R and A2R, generating Log A1R and Log A2R, which Add R receives to generate Log A1RA2R, which Exp Calc receives to generate A1RA2R, as found in the prior art.

Summary of Some Basic Problems of DSP:

Today, DSP solutions have limited arithmetic operational flexibility. Typically, only the operations of addition, subtraction, multiplication and shifting can be done during every instruction cycle. Even a slide rule has some form of divide, square root, logarithm and exponentiation. But today's DSP solutions cannot deliver these operations at anywhere near the rate of adds, subtracts and multiplications, if they can deliver them at all in a real-time effective manner.

Today, DSP solutions face another set of problems, based upon the need for continuous processing of deep filters which may involve multi-dimensional FFT's, DCT's and DWT's.

There is a large disparity today between processor clock rates and sensor sampling rates. Often sensors only generate between 20 million and 64 million samples per second, while the clock frequencies of processors are often between 300 and 1000 MHz. While DSP processors can run this fast, there are serious questions as to how to feed enough data into these engines to justify these clock speeds.

Often systems require real-time processing of many sensors. Today this is done by buffering each sensor cluster and then bursting these sensor clusters through the DSP resources. There are two separate, consequent problems. First, the system now has to manage the scheduling, storage and communication resources required to buffer the data, setup its transmission to the DSP resources, and then act upon the results. Second, these activities lead, almost inevitably, to differing latency for data from differing, equally valued, sensors, creating further scheduling and resource problems in handling the results.

SUMMARY OF INVENTION

The invention addresses at least all the above mentioned problems found in the prior art.

The invention includes apparatus and methods for high-speed calculation of non-linear functions based upon an arithmetic cell and a table collection. Each member of the table collection is driven by a first part of an input number, the arithmetic cell receives the entries of each table collection member at the first part, as well as a collection of remaining parts of the input number. The remaining part collection members effect small shifts and sometimes sign control of corresponding table entries to create effected table entries. The effected table entries are then added to a base table entry, which is not affected by the remaining part collection members, to generate the output of the arithmetic circuit.

The invention includes apparatus and methods for high-speed calculation of non-linear functions based upon a shifted adder and a offset generator. The offset generator is driven by a first order fraction of an input number, the shifted adder receives a collection of values, as well as a collection of successive higher fractions of the input number. The successive higher order fractions effect small shifts and sometimes sign control of corresponding value collection which are then added to a base value, to generate the output of the arithmetic circuit.

Various implementations may preferably include an input preprocessor and/or an output post processor.

By way of example, logarithms are preferably calculated base 2, with the most significant bit being one, mapping the calculation into the interval between one half and one. Logarithms preferably use a preprocessor to convert fixed point numbers into this range limited version, before the actual non-linear function calculation is performed. The inventors have found it often preferable for the log domain numbers to include indications of zero detection and sign detection of the input. Zero detection will be referred to herein as a negative infinity indication.

Multiplication and division can both result in numbers larger than the numeric domain can support. it is often preferable when translating these operations to adds and subtracts in the log domain for the log domain notation to support a positive infinity. Further, the normal arithmetic fact that zero multiplied by anything is zero leads to preferring that negative infinity indicated log domain numbers, when added to anything, including positive infinity, result in negative infinity being indicated.

Exponentiation is also preferably performed base 2. Exponentiation resulting in fixed point output preferably calculates the fractional part to a range between zero and one, and then shifts the result based upon the integer part of the input, which is preferably done with an output post processor. Post processor exponentiation often preferably includes forcing zeros, and negation, based upon negative infinity and sign indications.

Note that there are substantial reasons why a user of this arithmetic circuitry may prefer to perform calculations in the log domain of the log domain, which may further lead specific implementations to prefer two levels of sign indication and/or negative infinity indication.

Note sine/cosine often involve both an input preprocessor to range limit the input, often to the first quadrant of 90°, as well as an output post processor to control the sign of the output result.

These high speed calculators have a number of advantages. The calculators can support varying input/output configurations using a shared data path partition control signal(s). Relatively small tables and arithmetic circuits can provide excellent accuracy, sufficient to handle at least single precision floating point calculations of exponentiation and logarithms, sine and cosine, etc. for continuous throughput, real-time DSP applications, which is a capability unavailable today.

The invention includes a family of core cells built from instances of these calculators providing an upward, functionally compatible, extension to a family of Application Specific Integrated Circuit (ASIC) core cells. All of these core cells consistently provide the ability to perform high speed DSP tasks including Fast Fourier Transforms (FFTs), Finite Impulse Response (FIR) filters and Infinite Impulse Response (IIR) filters. The core cells built from the calculators can concurrently perform many non-linear function calculations. The core cells can switch between tasks every clock cycle.

The inventors have found that with 16 bit inputs and outputs, the Radix 4 engine of FIG. 12 essentially equals the FFT performance of the Texas Instruments 6415, which is the fastest DSP engines in production known to the inventors, as of the filing of this patent. This comparison is in terms of cycle counts. However, it should be noted that this engine is intended to be used in multiple instance networks to provide continuous FFT processing, so that the number of FFT's per second becomes the input clock frequency divided by the number of these engines applied to each Radix 4 Step. Assuming a 512 MHz clock cycle, one Radix 4 engine wide network, using five of these core cells provide 500,000 1 K point complex FFT's per second. According to Texas Instrument's web site documentation, the 6415 provides 100,000 at 600 MHz clock frequency.

Additionally, the inventors have found, again with 16 bit inputs and outputs, that the Radix 8 engine of FIG. 14 can be instantiated and configured to provide either reduced latency at continuous processing rates, or concurrently act as two Radix 4 engines. The inventors know of no DSP engine which can be reconfigured at run time to give the systems engineering community control over both processing rates and latency. The Radix 8 engine delivers twice the performance of the Radix 4 engine. Five Radix 8 engines can be configured to deliver 1 million 1K point complex FFTs per second, which can readily fit into typical medium to small digital integrated circuits today.

Both the Radix 4 engine of FIG. 12 and the Radix 8 engine of FIG. 14 can continuously provide multiple logarithms, exponentials, square roots, divisions, unavailable in contemporary solutions.

The invention includes an apparatus and method performing crucial DSP operations based upon using non-linear function calculators. Basic to these DSP operations is the continuous performance of a complex multiplication, which is preferably extended to include at least Radix 4, and Radix 8 steps required by various FFT's. This method provides an opportunity for not only efficiently performing the primary tasks of contemporary DSP, but also adding support for the real-time use of additional functions and operations including, but not limited to, division, square roots, logarithms, exponentiation, sine, cosine and many other functions.

These and many other advantages will become apparent to those skilled in the art upon considering the Figures, their description and the claim.

BRIEF DESCRIPTION OF DRAWINGS

FIGS. 2, 3, and 4A illustrate apparatus for a complex multiplier 100 providing a complex product of a first complex input with components A1R 10 and A1I 12, and a second complex number defined by a Log A2R 24 and an Log A2I 26;

FIG. 4B illustrates a more detailed view of the logarithm calculator collection, or the means for receiving 60 of FIG. 4A;

FIG. 4C illustrates a more detailed view of the first adder collection, providing a means for adding 70 of FIG. 4A;

DETAILED DESCRIPTION OF DRAWINGS

The invention includes an apparatus and method performing crucial DSP operations based upon using non-linear function calculators. Basic to these DSP operations is the continuous performance of a complex multiplication, which is preferably extended to include at least Radix 4, and Radix 8 steps required by various FFT's. This method provides an opportunity for not only efficiently performing the primary tasks of contemporary DSP, but also adding support for the real-time use of additional functions and operations including, but not limited to, division, square roots, logarithms, exponentiation, sine, cosine and many other functions.

In what follows the first complex input can be described as A1=A1R+A2I*j, where A1R 10 and A1I 12. The second complex input A2=A2R+A2I*j is defined by Log A2R 24 and Log A2I 26.

Figure 1A:
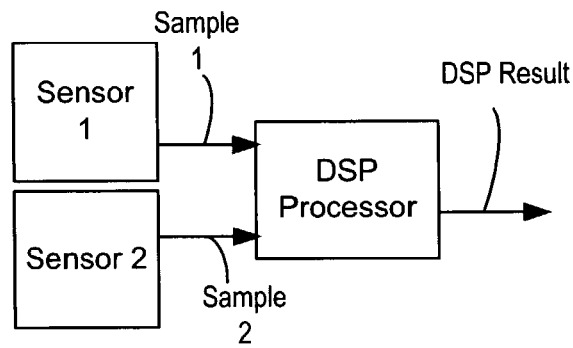
FIG. 1A illustrates a simplified block diagram of a DSP system applicable to cellular base station, medical imaging and instrumentation system applications as found in the prior art.
Figure 1B:
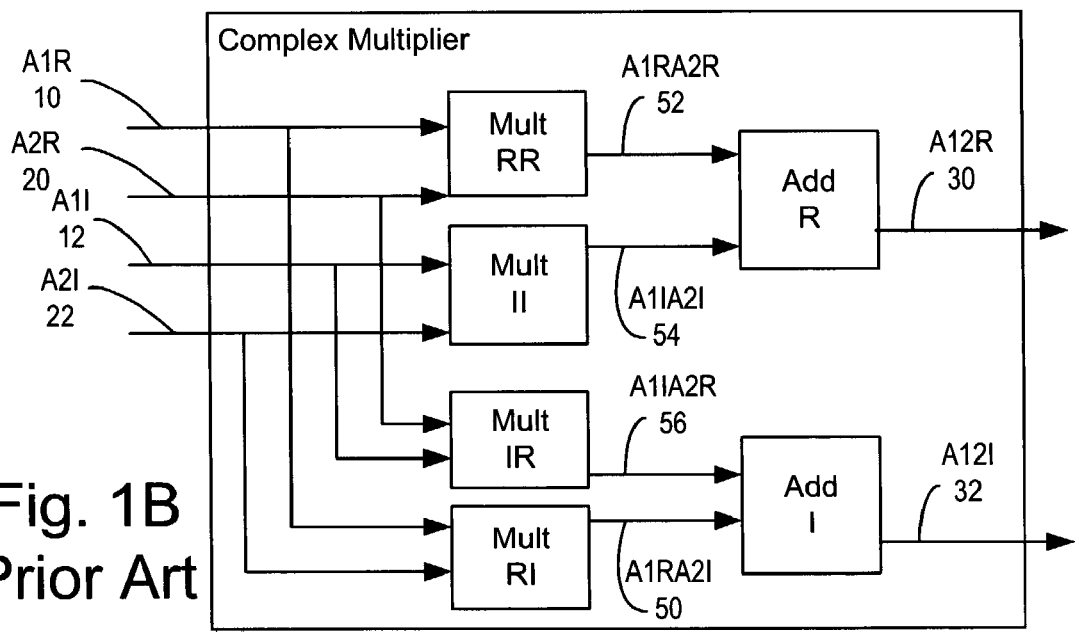
FIG. 1B illustrates a prior art complex multiplier multiplying A1 by A2 including four multipliers Mult RR, Mult RI, Mult IR and Mult II and two adders.
Figure 1C:
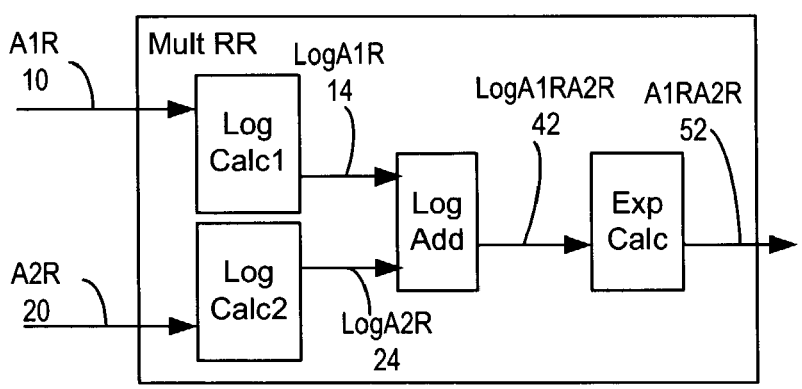
FIG. 1C illustrates multiplier Mult RR of FIG. 1B, containing two log calculators receiving A1R and A2R, generating Log A1R and Log A2R, which Add R receives to generate Log A1RA2R, which Exp Calc receives to generate A1RA2R, as found in the prior art.
Figure 2:
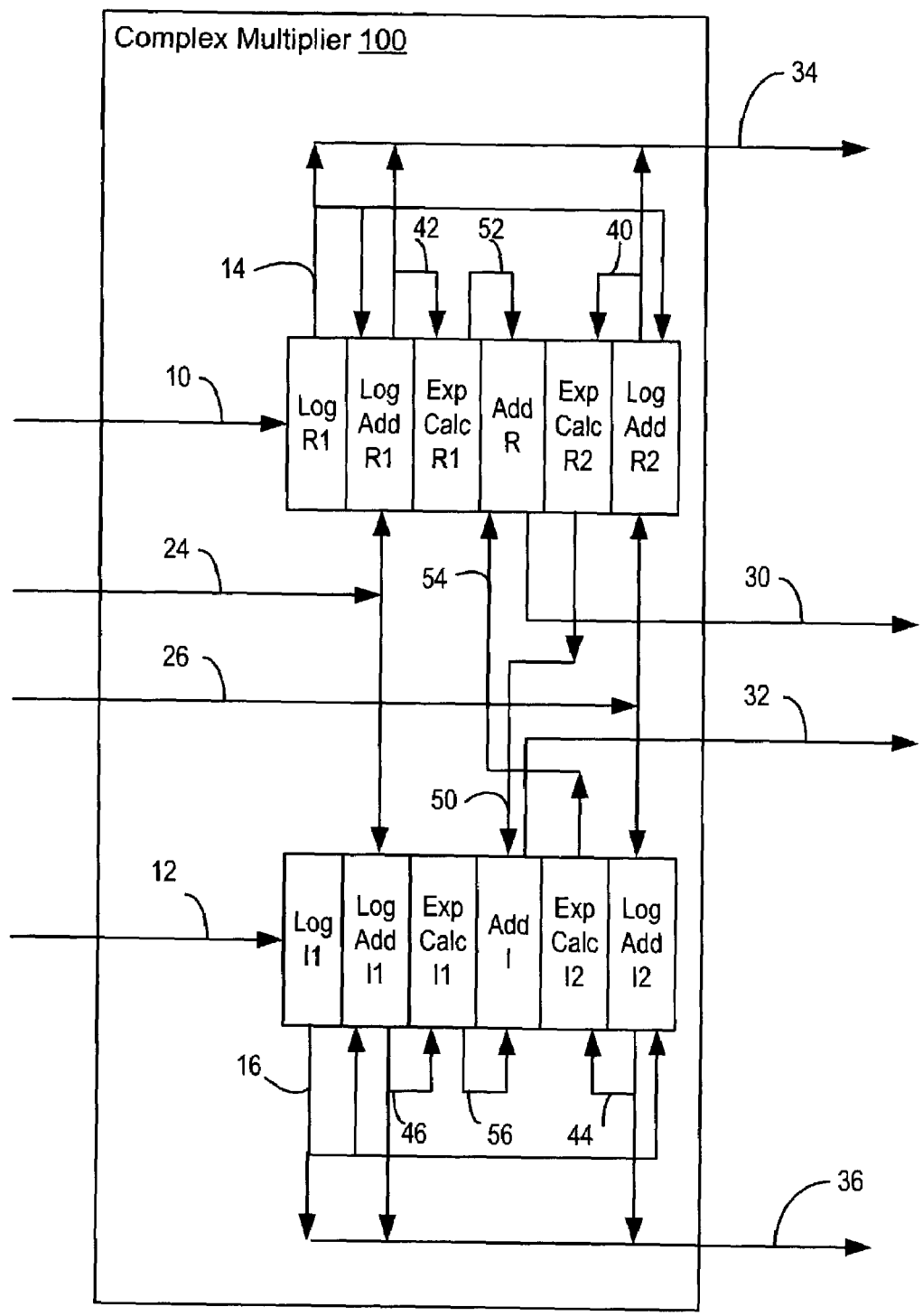
Figure 3:
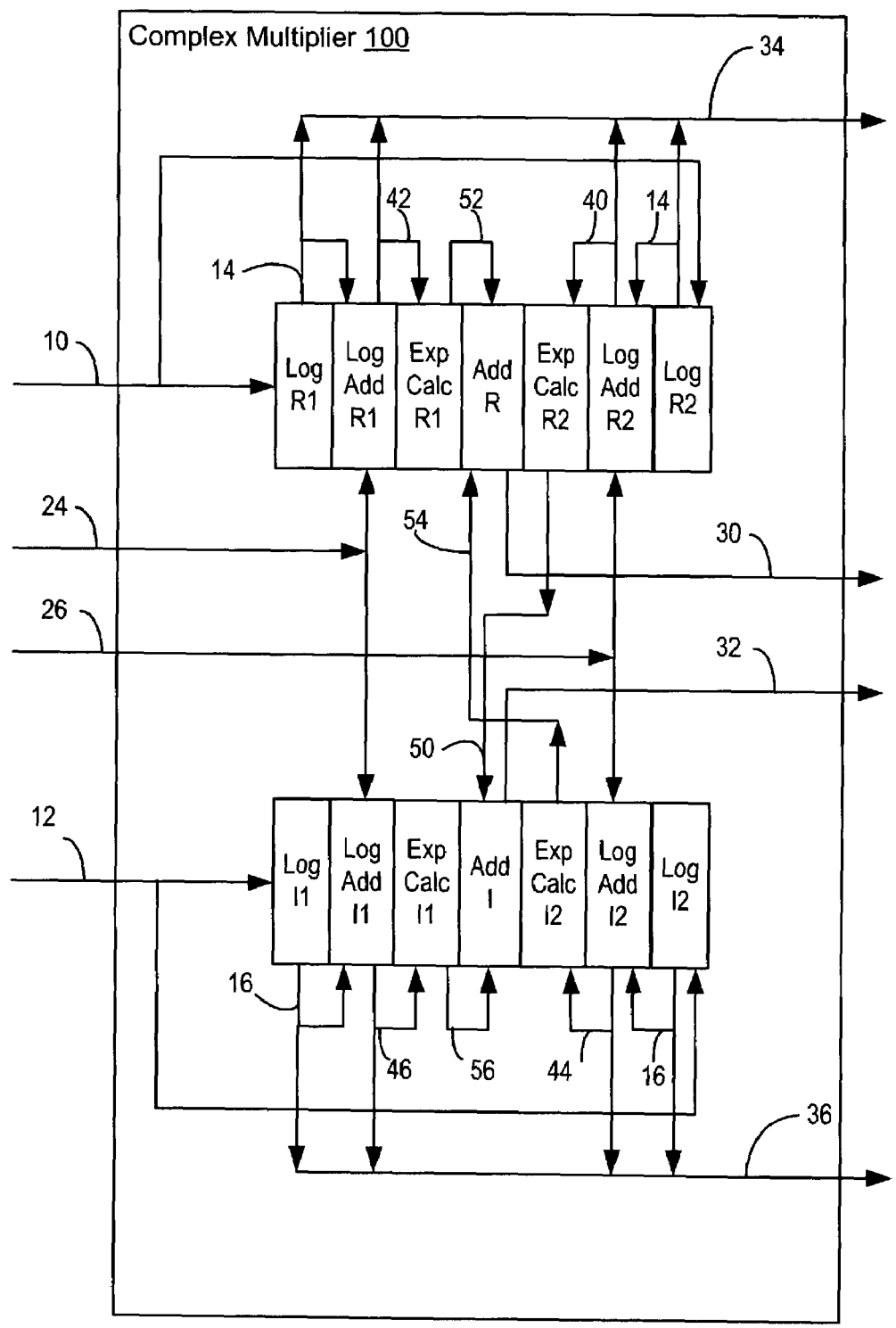

FIGS. 2, 3, and 4A illustrate apparatus for a complex multiplier 100 providing a complex product of a first complex input with components A1R 10 and A1I 12, and a second complex number defined by a Log A2R 24 and an Log A2I 26.

FIG. 4B illustrates a more detailed view of the logarithm calculator collection, or the means for receiving 60 of FIG. 4A.

FIG. 4C illustrates a more detailed view of the first adder collection, providing a means for adding 70 of FIG. 4A.

Figure 5A:
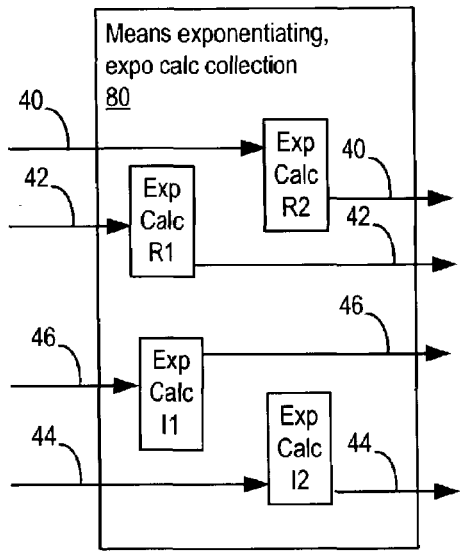
FIG. 5A illustrates a more detailed view of the exponential calculator collection, providing the means for exponentiating 80 of FIG. 4A.

FIG. 5A illustrates a more detailed view of the exponential calculator collection, providing the means for exponentiating 80 of FIG. 4A.

Figure 5B:
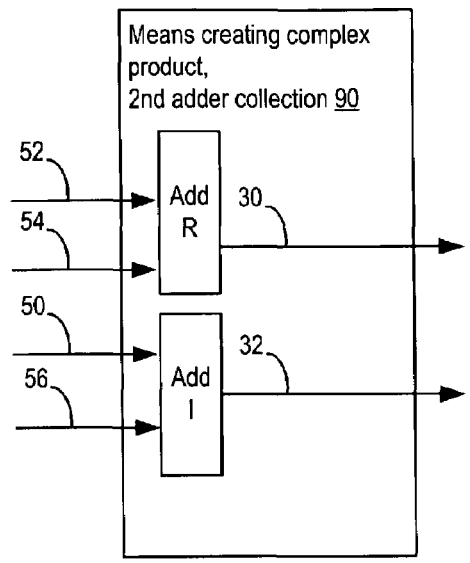
FIG. 5B illustrates a more detailed view of the second adder collection, providing a means for creating 90 of FIG. 4A.

FIG. 5B illustrates a more detailed view of the second adder collection, providing a means for creating 90 of FIG. 4A.

FIGS. 2 and 3 also illustrate preferably providing at least a version 34 and/or 36 of the logarithmic value of at least one component A1R 10 and/or A1I 12 of the first complex input.

By way of clarifying the invention, recall that prior art logarithms are defined only for positive real-valued number inputs. As used herein, logarithmic values preferably define inputs anywhere on the real number line, indicating the value of zero, as well as negative numbers, and include a non-trivial logarithm of the absolute value of the input whenever zero is not indicated.

The complex multiplier 100 of FIGS. 2, 3, and 4A provide a complex product by essentially the same method of operation.

In FIGS. 2, 3, and 4A, the first complex input includes a A1R 10 and a A1I 12. The first complex log version number includes a Log A1R 14 and a Log A1I 16.

In FIGS. 2, 3, 4A, and 4B, the first complex input is received to create a first complex log version number. A logarithm of the A1R 10 is calculated to create the Log A1R 14. A logarithm the A1I 12 is calculated to create the Log A1I 16.

In FIG. 2, Log R1 provides Log A1R 14 to both Log Add R1 and Log Add R2. In FIG. 3, Log R1 provides Log A1R 14 to Log Add R1 and Log R2 provides Log A1R 14 to Log Add R2.

In FIG. 2, Log I1 provides Log A1I 16 to both Log Add I1 and Log Add 12. In FIG. 3, Log I1provides Log A1I 16 to Log Add I1 and Log 12 provides Log A1I 16 to Log Add 12.

Note that in FIG. 3, the second pair of logarithmic calculators is shown to provide outputs. This has been done strictly for clarity of the Figure, and is not intended to limit the scope of the claimed invention. Aspects of the invention include providing the output of all logarithmic calculators outside the complex multiplier 100.

In FIGS. 2, 3, 4A, and 4C, the first complex log version number 14 Log A1R, and 16, Log A1I, is added to the Log A2R 24 to create a Log A1RA2R 42, and a Log A1IA2R 46. Meanwhile, Log AIR 14, and Log A1I 16, is added to the Log A2I 26 to create Log A1IRA2I 40, and Log A1IA2I 44.

Addition in the log domain is sufficient to define a multiplication. By way of example, Log A1IRA2R=Log A1R+Log A2R. Subtraction in the log domain is sufficient to define division, Log A1R/A2R=Log AIR−Log A2R. Dividing by two, which is a shifting down by one bit, is sufficient in the log domain to define a square root. The shifting can be upon the inputs of a log adder circuit such as Log Add R1, and/or upon the output of the adder.

When negative infinities are supported in the log domain, adding negative infinity to anything preferably yields negative infinity. Subtracting negative infinity from anything but negative infinity preferably results in positive infinity. Shifting negative infinity preferably results in negative infinity remaining indicated.

A complex log component collection includes the Log A1IRA2R 42, the Log A1IA2R 46, the Log A1IRA2I 40, and the Log A1IA2I 44.

A complex numeric component collection includes A1RA2R 52, A1IA2R 56, A1RA2I 50, and A1IA2I 54.

In FIGS. 2, 3, 4A, and 5A, each member of the complex log component collection is translated to create a corresponding member of the complex numeric component collection. An exponentiation of the Log A1IRA2R 42, is calculated to create the A1RA2R 52. An exponentiation of the Log A1IA2R 46, is calculated to create the A1IA2R 56. An exponentiation of the Log A1IRA2I 40, is calculated to create the A1RA2I 50. An exponentiation of the Log A1IA2I 44, is calculated to create the A1IA2I 54.

The complex product includes A12R 30 and A12I 32.

In FIGS. 2, 3, 4A, and 5B, a second collection of adders providing a means 90 for creating the complex product 30 and 32 from the complex numeric component collection 50 to 56. A1IA2I 54, is subtracted by Add R1 from A1IRA2R 52 to create A12R 30. The A1IRA2I 50 is added by Add I1to A1IA2R 56 to create the A12I 32.

Figure 5C:
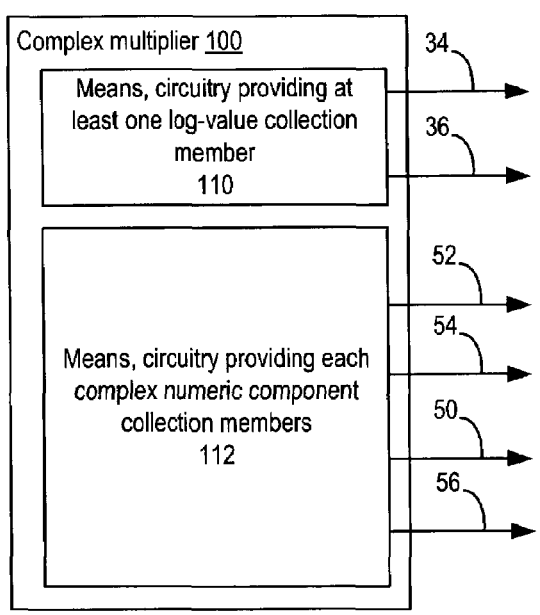
FIG. 5C illustrates complex multiplier 100 further including at least one of circuitry supporting a means 110 for providing at least one member of the log value collection, and circuitry supporting a means 112 for providing each of the complex numeric component members.

FIG. 5C illustrates complex multiplier 100 further including at least one of circuitry supporting a means 110 for providing at least one member of the log value collection, and circuitry supporting a means 112 for providing each of the complex numeric component members.

Figure 5D:
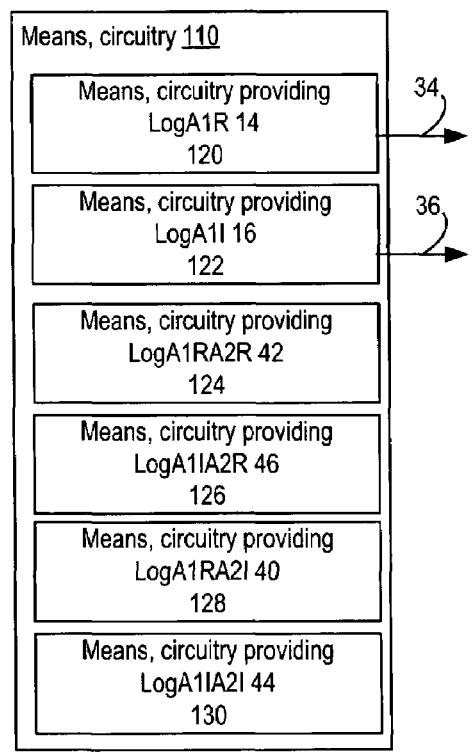
FIG. 5D further illustrates the circuitry supporting a means 110 for providing at least one member of the log value collection of FIG. 5C.

FIG. 5D further illustrates the circuitry supporting a means 110 for providing at least one member of the log value collection of FIG. 5C.

In FIGS. 2, 3, version 34 of the logarithmic value of component 10, A1R, includes at least one of Log A1R 14, Log A1R, Log A1RA2R 42, Log A1RA2R, and Log A1RA2I 40, Log A1RA2I. Version 36 of the logarithmic value of component 12, A1I, includes at least one of Log A1I 16, Log A1I, Log A1IA2I 44, Log A1IA2I, and Log A1IA2R 46, Log A1IA2R.

In FIG. 5D, version 34 is preferably the logarithmic value of A1R 10, which is Log A1R 14. Version 36 is preferably the logarithmic value of A1I 12, which is Log A1I 16.

Figure 6A:
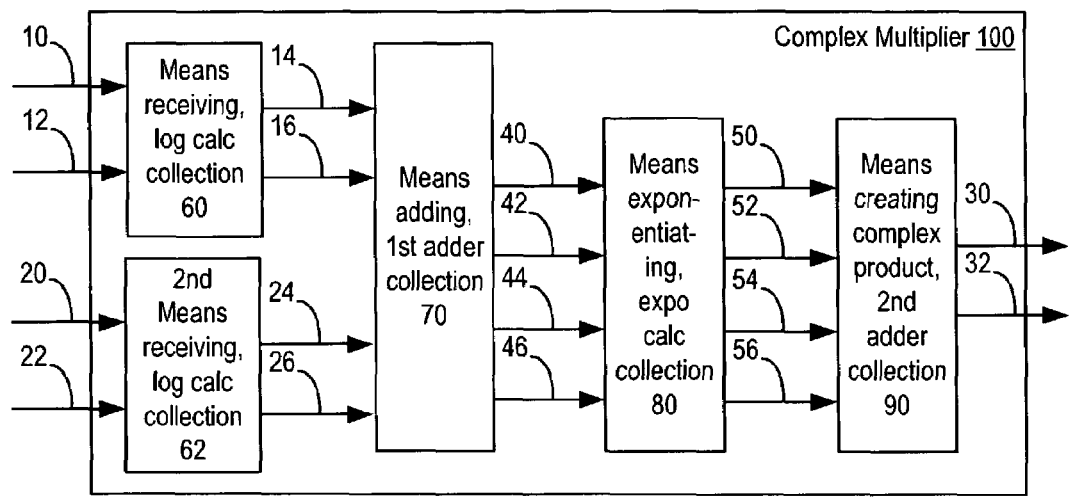
FIG. 6A illustrates a refinement of the complex multiplier 100 of FIG. 4A further including a second collection of logarithm calculators supporting a second means 62 of receiving the second complex input A2R 20 and A2I 22 to create log A2R 24 and log A2I 26.

FIG. 6A illustrates a refinement of the complex multiplier 100 of FIG. 4A further including a second collection of logarithm calculators supporting a second means 62 of receiving the second complex input A2R 20 and A2I 22 to create log A2R 24 and log A2I 26.

Figure 6B:
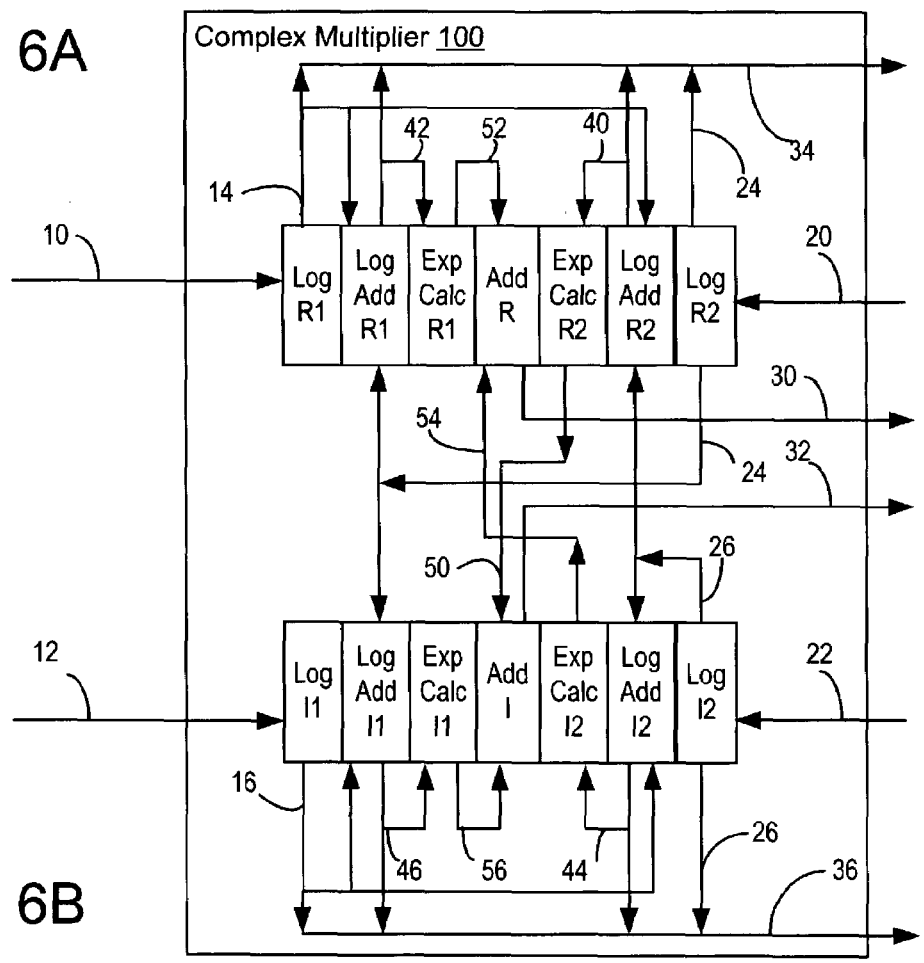
FIG. 6B illustrates a refinement of the complex multiplier 100 of FIG. 2 further including a second collection of logarithm calculators supporting a second means 62 of receiving the second complex input A2R 20 and A2I 22 to create Log A2R 24 and Log A2I 26, as well as providing Log A2R 24 for potential output 34 and Log A2I 26 for potential output 36.

FIG. 6B illustrates a refinement of the complex multiplier 100 of FIG. 2 further including a second collection of logarithm calculators supporting a second means 62 of receiving the second complex input A2R 20 and A2I 22 to create Log A2R 24 and Log A2I 26, as well as providing Log A2R 24 for potential output 34 and Log A2I 26 for potential output 36.

In FIG. 6B, Log R2 receives A2R 20 and generates Log A2R 24, which is provided to Log Add R1 and Log Add I1.

Log 12 receives A2I 22 and generates Log A2I 26, which is provided to Log Add R2 and Log Add 12.

Figure 7A:
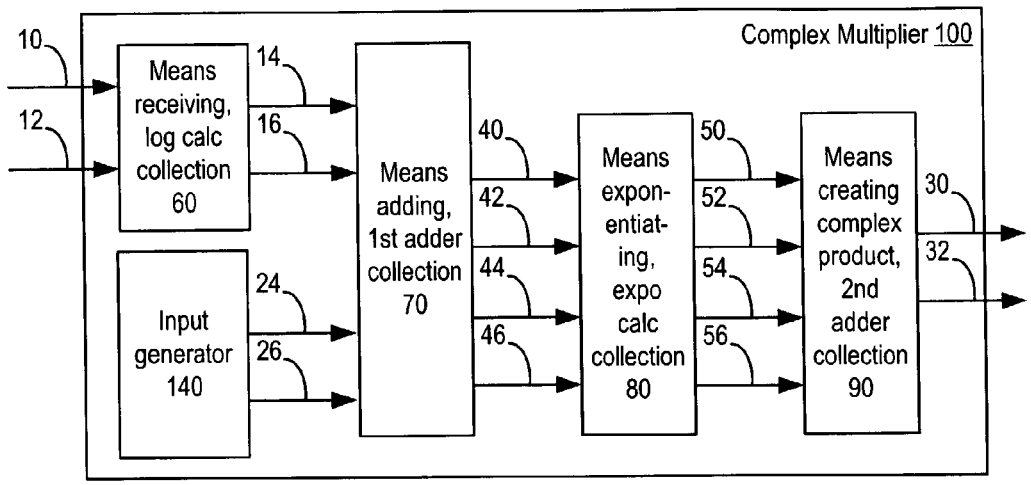
FIG. 7A illustrates a refinement of the complex multiplier 100 of FIG. 4A further including input generator 140 providing Log A2R 24 and Log A2I 26.

FIG. 7A illustrates a refinement of the complex multiplier 100 of FIG. 4A further including input generator 140 providing Log A2R 24 and Log A2I 26.

In various situations, input generator 140 may include at least one of the following: a memory, a combinatorial logic network, a finite state machine, or as a network including at least two instance of these three elements: memories, combinatorial logic networks and finite state machines.

The inventors realized after examining the Cooley-Tukey Radix 4 operations, that each operation involved a single complex product, which was used in either its original form, or in the other three quadrant phase shifted versions. Each component of these quadrant shifted forms amounted to selecting either the real or imaginary component of the complex product, and then possibly negating it. This meant that dual arithmetic logic units, each able to select from the complex product components could use that selected component to either add or subtract it either from the current complex value component or zero to establish the new complex value component.

The inventors also discovered that Cooley-Tukey Radix 8 operations involve the original complex product and half quadrant phase shifted versions of the complex product. The half quadrant phase shifted version of the complex product amounted to multiplying the complex product by the square root of one half, which is the value of both the cosine and sine of the half quadrant, also known as 45°.

These insights lead them to develop FFT radix engines with a minimum of one full complex multiplier feeding anywhere from 4 to 8 circuits creating new complex values in a variety of ways, each possessing advantages over all other known approaches which will be summarized in the following text and illustrated in FIGS. 7B to 13A, and 14.

Figure 12:
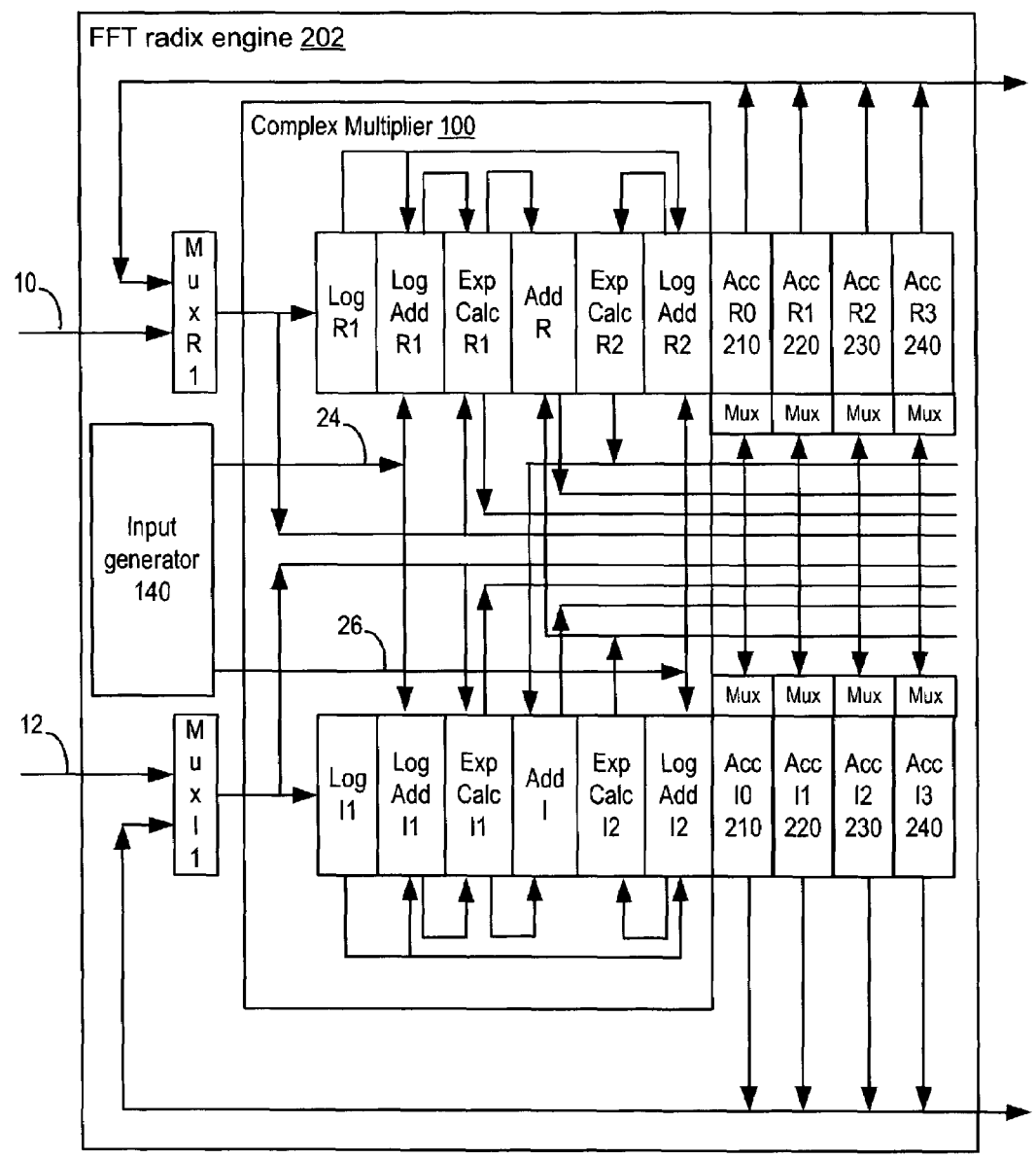
FIG. 12 illustrates a refinement of the FFT radix engine 202 of FIG. 8 further providing at least one member of the log-value collection 34 to at least one of the circuits 210, 220, 230, and/or 240.

In particular, the inventors have found that with 16 bit inputs and outputs, the Radix 4 engine of FIG. 12 essentially the FFT performance of the Texas Instruments 6415, which is the fastest DSP engine in production known to the inventors, as of the time of the filing of this patent. This comparison is in terms of cycle counts. However, it should be noted that this engine is intended to be used in multiple instance network to provide continuous FFT processing, so that the number of FFT's per second becomes the input clock frequency divided by the number of these engines applied to each Radix 4 Step. Assuming a 512 MHz clock cycle, one Radix 4 engine wide network, using five of these core cells provide 500,000 1 K point complex FFT's per second. According to Texas Instrument's web site documentation, the 6415 provides 100,000 at 600 MHz.

Figure 14:
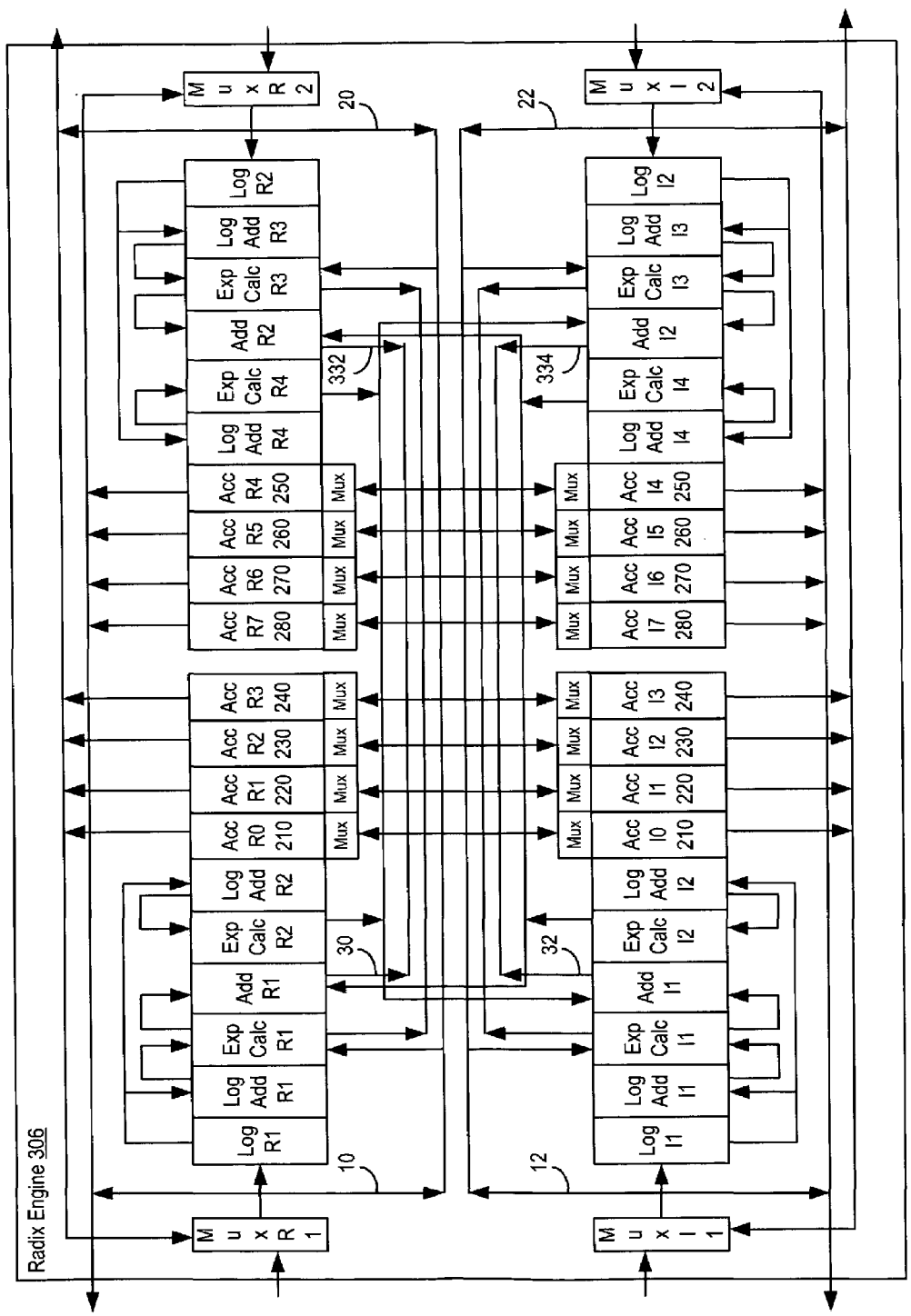
FIG. 14 illustrates a further refinement 306 of the FFT radix engines of FIGS. 9, 10 and 13A capable of operating as two instances of Radix 4 engines of FIG. 12.

Additionally, the inventors have found, again with 16 bit inputs and outputs, that the Radix 8 engine of FIG. 14 can be instantiated and configured to provide either reduced latency at continuous processing rates, or act as two Radix 4 engines. The inventors know of no DSP engine which can be reconfigured at run time to give the systems engineering community control over both processing rates and latency. The Radix 8 engine delivers twice the performance of the Radix 4 engine. Five Radix 8 engines can be configured to deliver 1 million 1K point complex FFTs per second, which can readily fit into typical medium to small digital integrated circuits today.

Figure 7B:
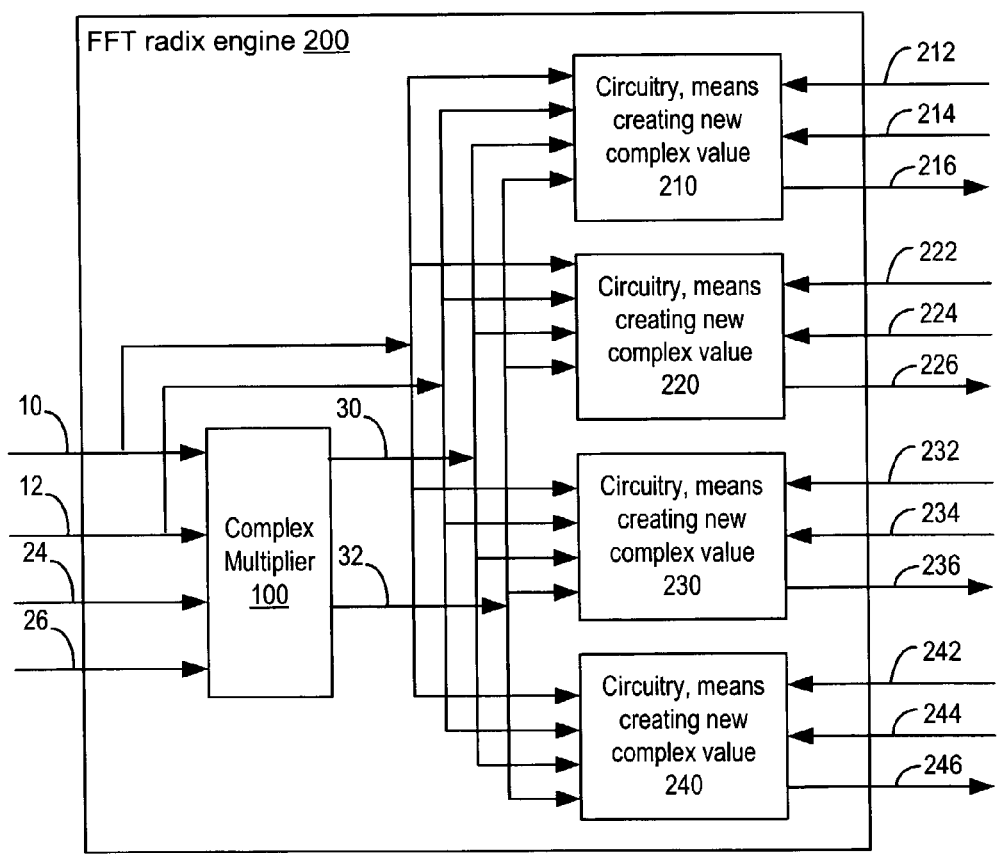
FIG. 7B illustrates an FFT radix engine 200 for performing at least an FFT radix operation based upon the first complex input A1R 10 and A1I 12, including complex multiplier 100 of FIGS. 2, 3, 4A, further including at least two (four illustrated) circuitry supporting means for creating new complex values based upon the complex input 10 and 12, complex product 30 and 32, current complex values, and corresponding controls.

FIG. 7B illustrates an FFT radix engine 200 for performing at least an FFT radix operation based upon the first complex input A1R 10 and A1I 12, including complex multiplier 100 of FIGS. 2, 3, 4A, further including at least two (four illustrated) circuitry supporting means for creating new complex values based upon the complex input 10 and 12, complex product 30 and 32, current complex values, and corresponding controls.

Figure 8:
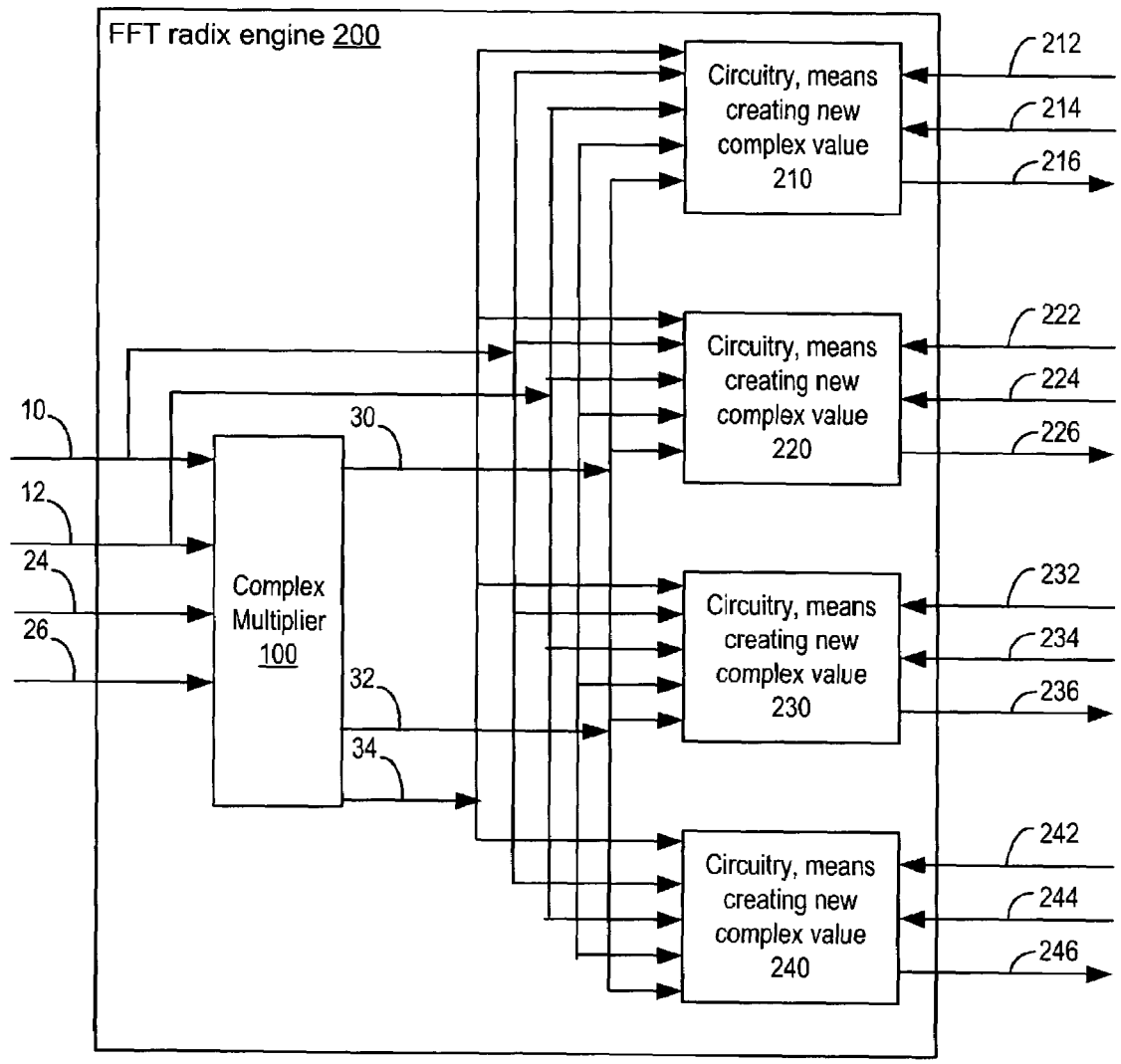
FIG. 8 illustrates a refinement of the FFT radix engine 200 of FIG. 7B further providing at least one member of the log-value collection 34 to at least one of the circuits 210, 220, 230, and/or 240.

FIG. 8 illustrates a refinement of the FFT radix engine 200 of FIG. 7B further providing at least one member of the log-value collection 34 to at least one of the circuits 210, 220, 230, and/or 240.

Figure 9:
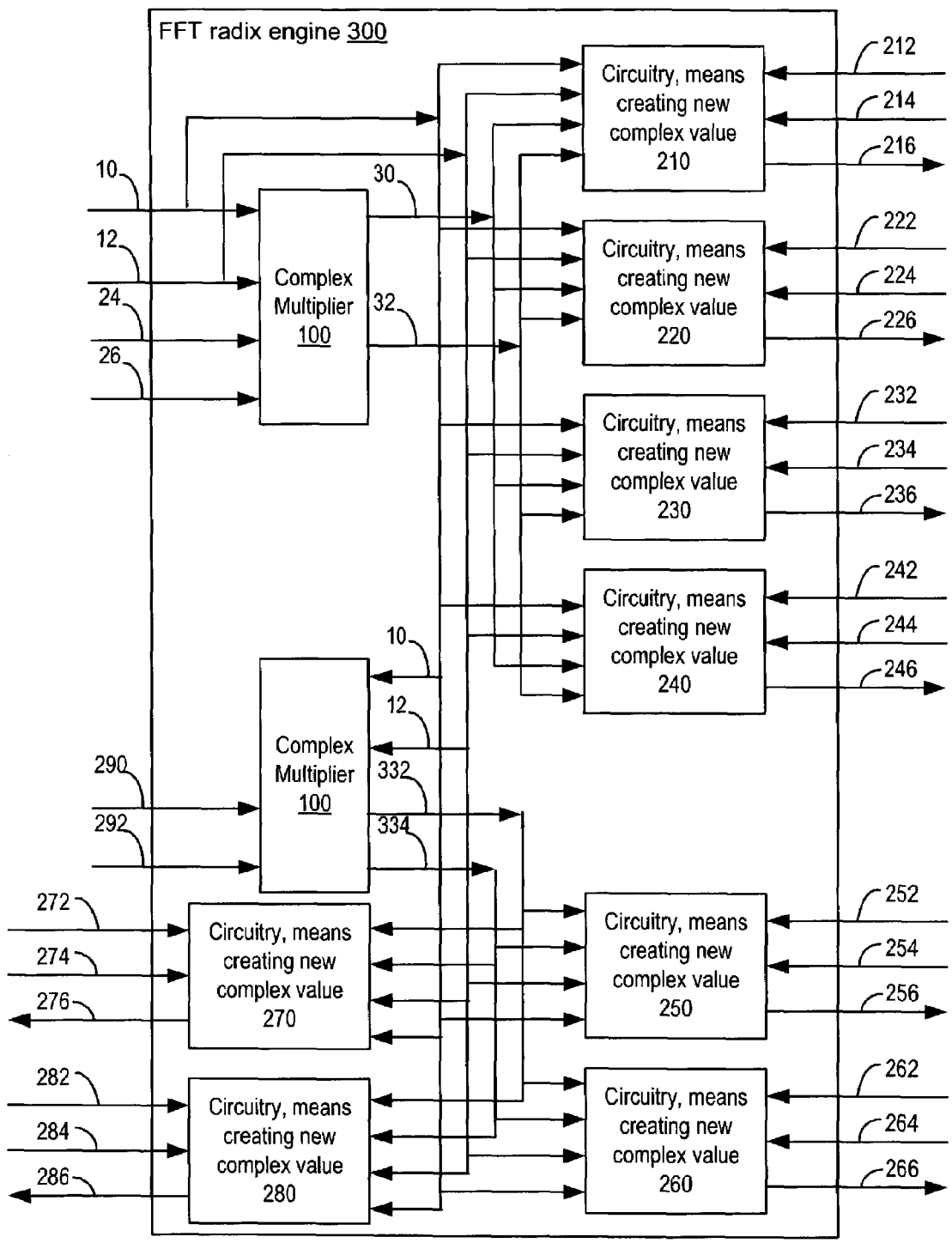
FIG. 9 illustrates a refinement 300 of the FFT radix engine of FIG. 7B including 8 circuits supporting creating new complex values and a second complex multiplier 100 receiving the complex input 10 and 12 to generate a second complex product 332 and 334.

FIG. 9 illustrates a refinement 300 of the FFT radix engine of FIG. 7B including 8 circuits supporting creating new complex values and a second complex multiplier 100 receiving the complex input 10 and 12 to generate a second complex product 332 and 334.

Figure 10:
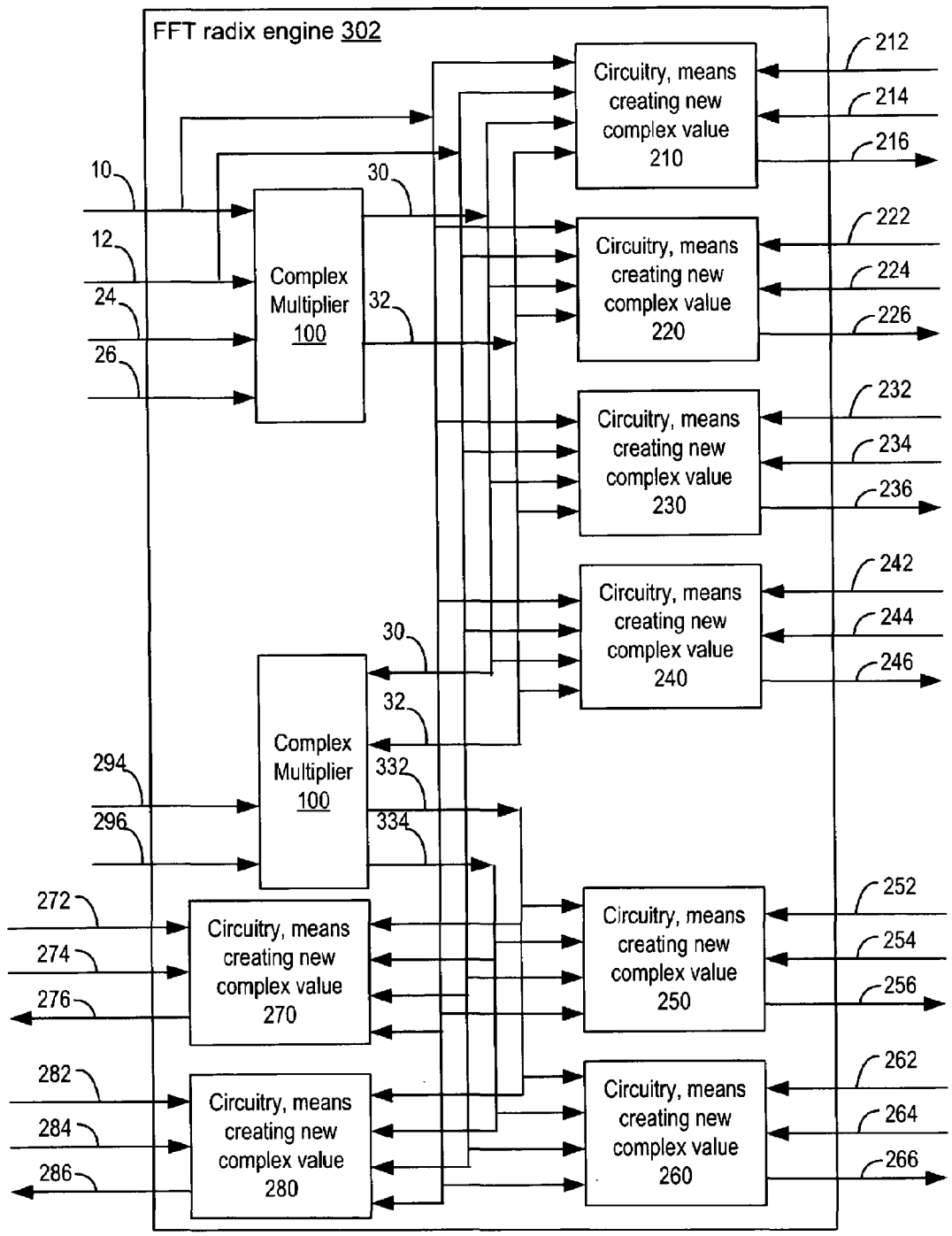
FIG. 10 illustrates a refinement 302 of the FFT radix engine of FIG. 7B including 8 circuits supporting creating new complex values and a second complex multiplier 100 receiving the complex product 30 and 32 to generate a second complex product 332 and 334.

FIG. 10 illustrates a refinement 302 of the FFT radix engine of FIG. 7B including 8 circuits supporting creating new complex values and a second complex multiplier 100 receiving the complex product 30 and 32 to generate a second complex product 332 and 334.

Figure 11:
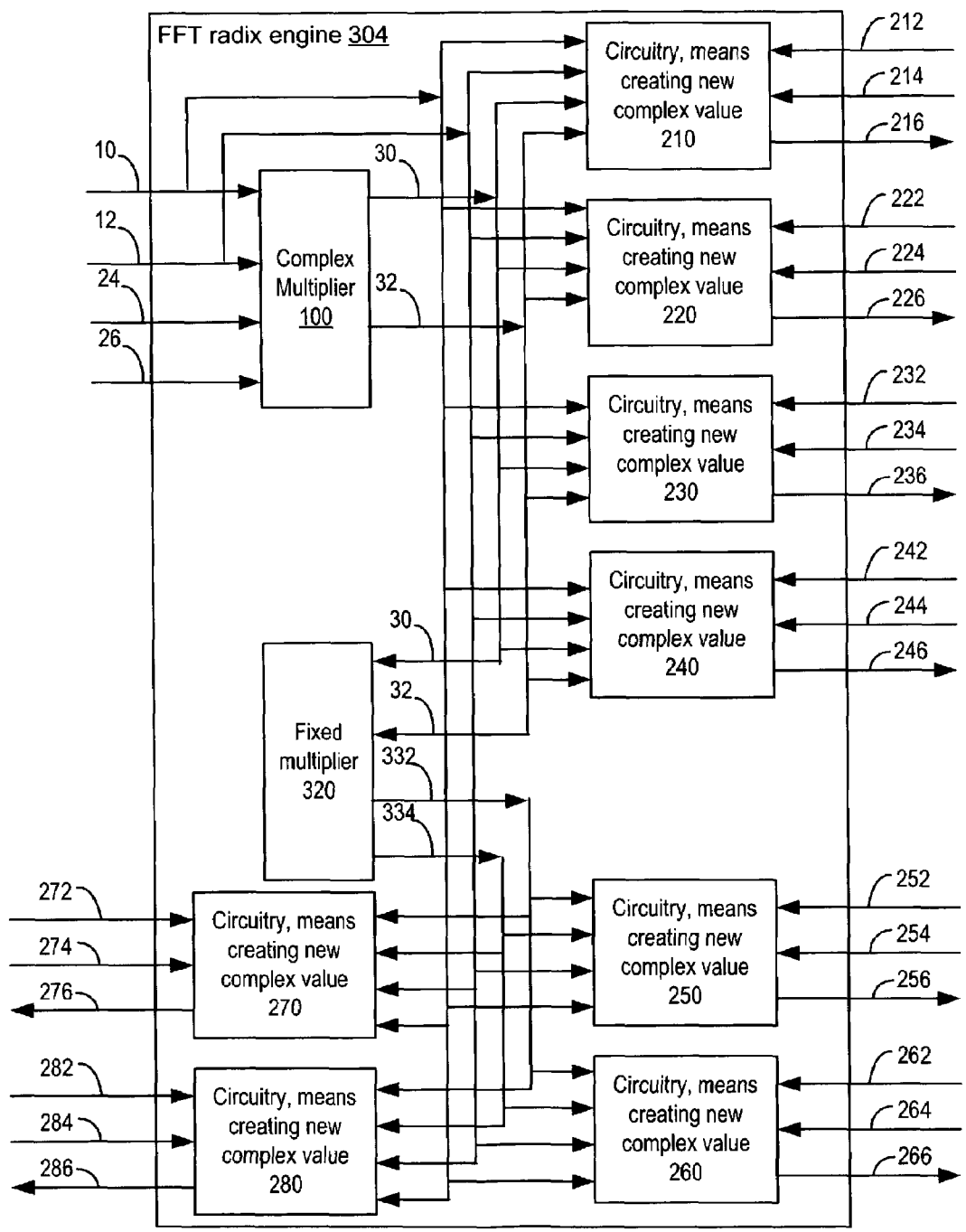
FIG. 11 illustrates a refinement 304 of the FFT radix engine of FIG. 7B including 8 circuits supporting creating new complex values and a fixed multiplier 320 receiving the complex product 10 and 12 to generate a second complex product 332 and 334.

FIG. 11 illustrates a refinement 304 of the FFT radix engine of FIG. 7B including 8 circuits supporting creating new complex values and a fixed multiplier 320 receiving the complex product 10 and 12 to generate a second complex product 332 and 334.

FIG. 12 illustrates a refinement of the FFT radix engine 202 of FIG. 8 further providing at least one member of the log-value collection 34 to at least one of the circuits 210, 220, 230, and/or 240.

Figure 13A:
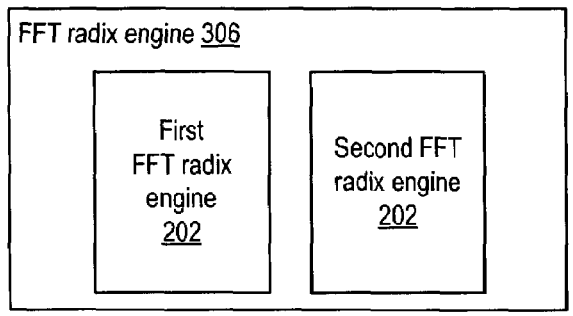
FIG. 13A illustrates a refinement 306 of the FFT radix engines of FIGS. 9 and 10 organized as two instances of Radix 4 engines of FIG. 12.

FIG. 13A illustrates a refinement 306 of the FFT radix engines of FIGS. 9 and 10 organized as two instances of Radix 4 engines of FIG. 12.

Figure 13B:
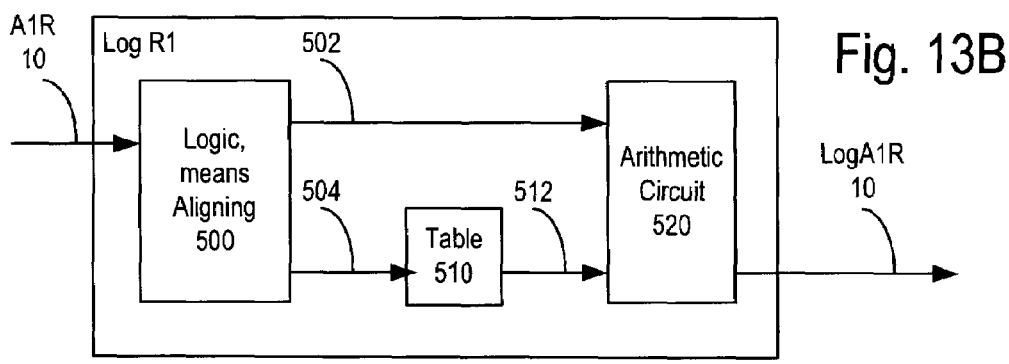
FIG. 13B illustrates an embodiment of Log R1, a logarithm calculator found in FIGS. 2, 3, 4B, 6B, 12 and 14.

FIG. 13B illustrates an embodiment of Log R1, a logarithm calculator found in FIGS. 2, 3, 4B, 6B, 12 and 14, including at least one of a logic circuit 500 supporting means for aligning the component input A1R 10 to access 504 a table 510 and drive 502 an arithmetic circuit 520 fed 512 by the table 510.

Figure 13C:
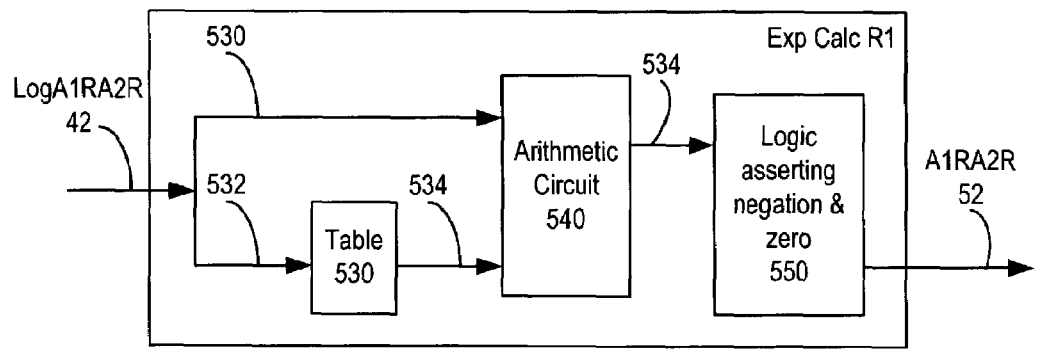
FIG. 13C illustrates an embodiment of Exp Calc R1, an exponential calculator found in FIGS. 2, 3, 5A, 6B, 12 and 14.

FIG. 13C illustrates an embodiment of Exp Calc R1, an exponential calculator found in FIGS. 2, 3, 5A, 6B, 12 and 14, including at least one of a table 530, an arithmetic circuit 540 fed by table 530, and a logic circuit 550 operating upon an output 534 of the arithmetic circuit 540 to establish at least negation and zero for the exponentiation.

Tables 510 and 530 may be implemented as at least a memory, a combinatorial logic network, and a second combinatorial logic network feed by at least one of the memory and the combinatorial logic network.

FIG. 14 illustrates a further refinement 306 of the FFT radix engines of FIGS. 9, 10 and 13A capable of operating as two instances of Radix 4 engines of FIG. 12.

In FIGS. 7B, 8, 9, 10, 11, 12, 13A, and 14, the radix engine includes at least one complex multiplier 100 providing complex product 30 and 32 using Log A2R 24 and Log A2I 26 to define the second complex input.

In FIGS. 7B, 8, 9, 10, 11, 12, 13A, and 14, the radix engine includes at least two circuits supporting means for creating a new complex value based upon the current complex value, a control for the current complex value, the complex input, and the complex product. By way of example, circuitry 210 creating a new complex value 216 based upon the current complex value 212, a control 214 for the current complex value 212, the complex input 10–12, and the complex product 30–32.

The implications of quadrant phase shifted versions of a complex product are that creating the real and imaginary components of new complex values amount to adding or subtracting the real and imaginary components of the complex input or the complex product to a current complex value's real and imaginary component, respectively.

FIGS. 12 and 14 illustrate this preferred approach by corresponding accumulators in the top row and the bottom row sharing the same circuitry reference number for creating the new complex values. See for example Acc R0 210 and Acc I0 210 in FIGS. 12 and 14. Each component of these quadrant shifted complex numbers amounts to selecting either the real or imaginary component of the complex product, or the complex input, and then possibly negating it. This meant that dual arithmetic logic units, each able to select from the complex product or input components could use that selected component to either add or subtract it either from the current complex value component or zero to establish the new complex value component.

The inventors also discovered that Cooley-Tukey Radix 8 operations involve the original complex product and half quadrant phase shifted versions of the complex product. The half quadrant phase shifted version of the complex product amounted to multiplying the complex product by the square root of one half, which is the value of both the cosine and sine of the half quadrant, also known as 45°.

In FIGS. 7B, 8, and 12, the radix engine includes exactly four circuits supporting means for creating a new complex value based upon the current complex value, a control for the current complex value, the complex input, and the complex product.

In FIGS. 9, 10, 11, and 14, the radix engine includes eight circuits supporting means for creating a new complex value based upon the current complex value, a control for the current complex value, the complex input, and the complex product.

In FIGS. 8, 12, and 14, the complex multiplier includes circuitry providing at least one member of the log-value collection, as well as at least one of the circuitry creating the new complex values includes means for creating at least a component of the current complex value based upon the current complex value, the control, the complex input, the complex product and the provided log-value collection member.

In FIGS. 7B, 8, 9, 10, 11, 12, 13A, and 14, the FFT radix operation includes at least an FFT Radix 2 operation and further includes at least an FFT Radix 4 operation.

In FIGS. 9, 10, 11, 13A, and 14, the radix engine can perform an FFT Radix 8 operations and includes circuitry calculating a second complex product 334 and 336 based upon at least one the first complex input 10–12 and the complex product 30–32.

In FIGS. 10, 11, and 14, the radix engine includes circuitry capable of calculating the second complex product as a multiple of the complex product.

In FIGS. 9, 13A, and 14, the radix engine includes a second of the complex multipliers capable of providing the second complex product 334–336 from the complex input 30–32

In FIGS. 10, 11, 13A, and 14, the radix engine includes circuitry capable of calculating a fixed multiple of the complex product 30–32 to create the second complex product 334–336.

In FIGS. 10, 13A, and 14, the radix engine includes another complex multiplier capable of receiving the complex input as the complex product 30–32 and the second complex input approximating the fixed multiple.

FIGS. 15A to 22E illustrate various aspects of the invention including apparatus and methods for high-speed calculation of non-linear functions based upon a shifted adder 710 and a offset generator 720. The offset generator 720 is driven by a first order fraction In0 704 of an input number 702, the shifted adder 710 receives a collection of values, as well as a collection of successive higher fractions In1 706-1 to at least In3 706-3 of the input number 702. The successive higher order fractions effect small shifts and sometimes sign control of corresponding value collection which are then added to a base value, to generate the output of the arithmetic circuit.

Various implementations may preferably calculated base 2, with the most significant bit being one, mapping the calculation into the interval between one half and one. Logarithms preferably use a preprocessor to convert fixed point numbers into this range limited version, before the actual non-linear function calculation is performed. The inventors have found it often preferable for the log domain numbers to include indications of zero detection and sign detection of the input. Zero detection will be referred to herein as a negative infinity indication.

Multiplication and division can both result in numbers larger the a numeric domain can support. It is often preferable when translating these operations to adds and subtracts in the log domain for the log domain notation to support a positive infinity. Further, the normal arithmetic fact that zero multiplied by anything is zero leads to preferring that negative infinity indicated log domain numbers, when added to anything, including positive infinity, result in negative infinity being indicated.

Exponentiation is also preferably performed base 2. Exponentiation resulting in fixed point output preferably calculates the fractional part to a range between zero and one, and then shifts the result based upon the integer part of the input, which is preferably done with an output post processor. Post processor exponentiation often preferably includes forcing zeros, and negation, based upon negative infinity and sign indications.

Note that there are substantial reasons why a user of this arithmetic circuitry may prefer to perform calculations in the log domain of log domain, which may further lead specific implementations to prefer two levels of sign indication and/or negative infinity indication.

Note sine/cosine often involve both an input preprocessor to range limit the input, often to the first quadrant of 90°, as well as an output post processor to control the sign output result.

It is often preferred that the non-linear function is a version of exponentiation, a version of logarithm, or a version of a trigonometric function, where the trigonometric function is a sine, cosine, or any linear combination of said sine and said cosine.

The version of exponentiation may include, but is not limited to, at least a full-range version of exponentiation, range-limited version exponentiation over a limited range, a binary-base version of exponentiation, a decimal-base version of exponentiation, and a natural-base version of exponentiation.

The version of logarithm may include, but not limited to, at least one of: a full-range version logarithm, a range-limited version logarithm over a limited range, a binary-range version of logarithm, a decimal-base version of logarithm, and a natural-base version of logarithm.

The version of the trigonometric function may include, but is not limited to, at least one of a full-range version of the trigonometric function, a range-limited version of the trigonometric function, a linear transformed range version of the trigonometric function, and a linear transformed, range-limited version of the trigonometric function.

Input In 702 represents at least one of the following in various preferred embodiments: an unsigned integer range of K bits, a signed integer range of K bits, a fixed point range of K bits, a mantissa of K bits, a leading bit mantissa of K bits, a floating point number of L bits with a mantissa of K bits, an extended number including a K bit fraction, and an extended number including floating point number of L bits with a mantissa of K bits. K is preferred to be least 12, and L is preferred to be greater than K. the extended number may include at least one negative infinity indication and/or at least one sign indication.

Note that there are situations comtemplated by the invention in which the fractional parts In0 704 and In1 706-1 to In3 706-3 of In 702 may overlap. Such conditions may be preferred when a redundant, possibly error control coding scheme is used in a quantum calculator or other very small infrastructure environment.

These high speed calculators have a number of advantages. The calculators can support varying input/output configurations using a shared data path partition control signal(s). Relatively small tables and arithmetic circuits can provide excellent accuracy, sufficient to handle at least single precision floating point calculations of exponentiation and logarithm, sine and cosine, etc. for continuous throughout, real-time DSP applications, which is a capability unavailable today.

Figure 15A:
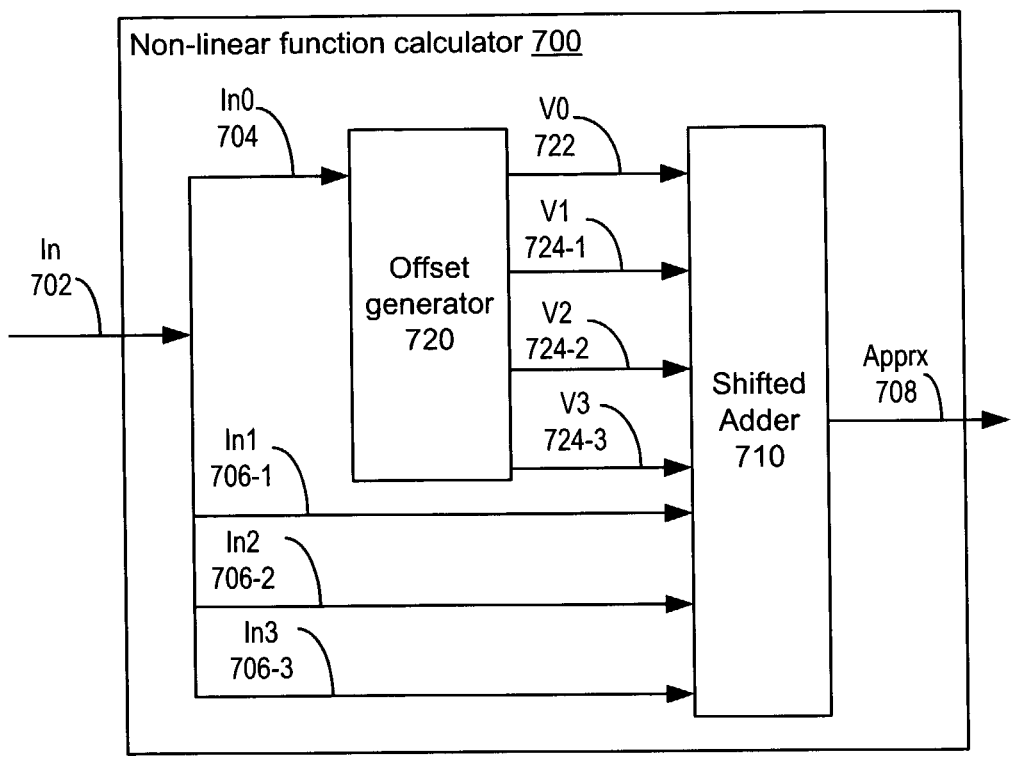
FIG. 15A illustrates a non-linear function calculator 700 in accord with certain aspects of the invention.

FIG. 15A illustrates a non-linear function calculator 700 in accord with certain aspects of the invention.

Figure 15B:
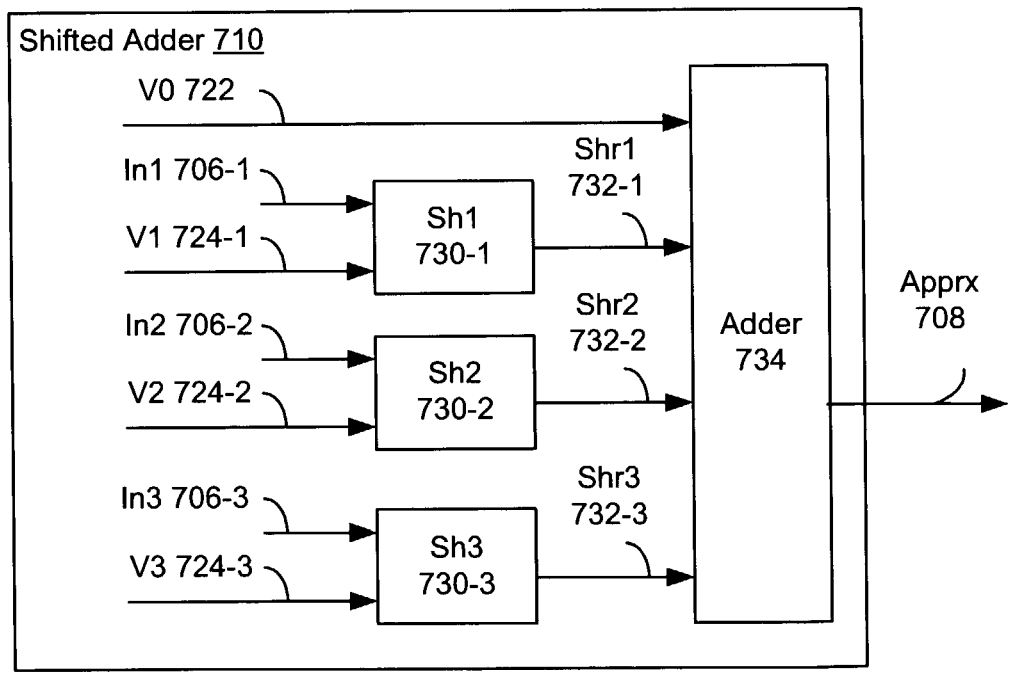
FIG. 15B illustrates a more detailed view of the shifted adder 710 of FIG. 15A.

FIG. 15B illustrates a more detailed view of the shifted adder 710 of FIG. 15A.

FIG. 16A to 17B illustrates a variety of embodiments of offset generator 720 of FIG. 15A.

Figure 18A:
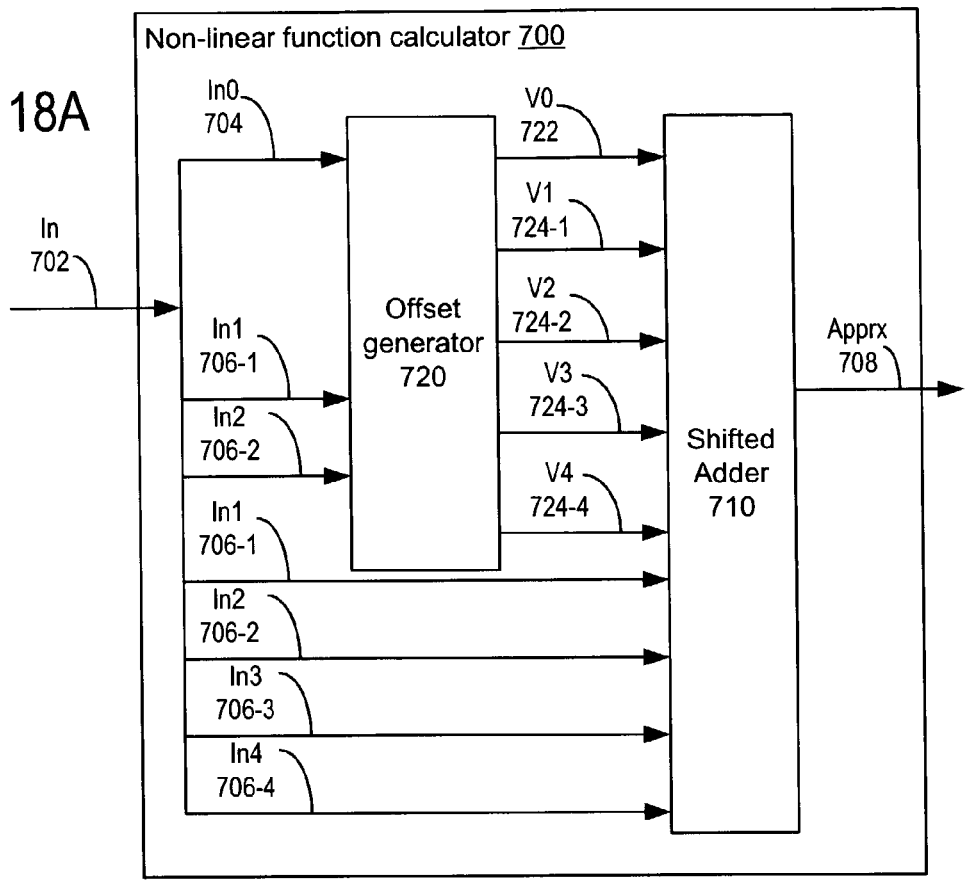
FIG. 18A illustrates a refinement of the non-linear function calculator 700 of FIG. 15A using four successive higher order fractions.

FIG. 18A illustrates a refinement of the non-linear function calculator 700 of FIG. 15A using four successive higher order fractions.

Figure 18B:
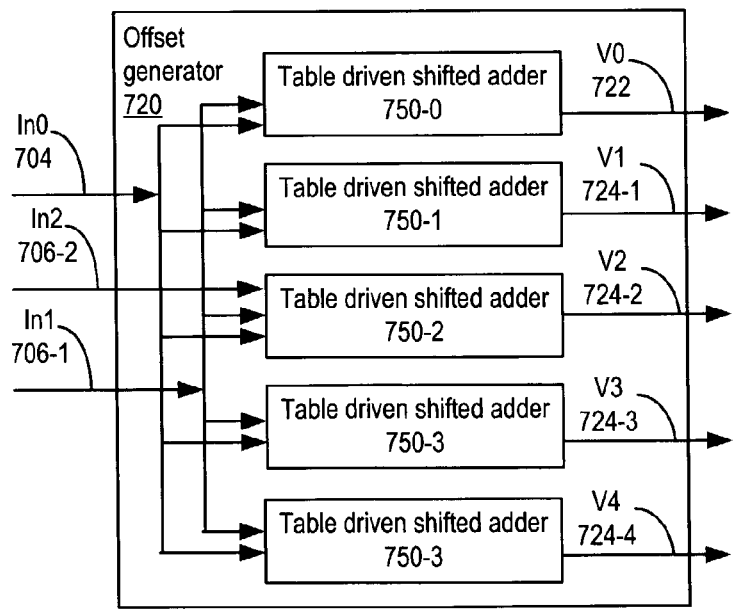
FIG. 18B illustrates a refinement of the offset generator 720 for FIG. 18A.

FIG. 18B illustrates a refinement of the offset generator 720 for FIG. 18A.

Figure 19:
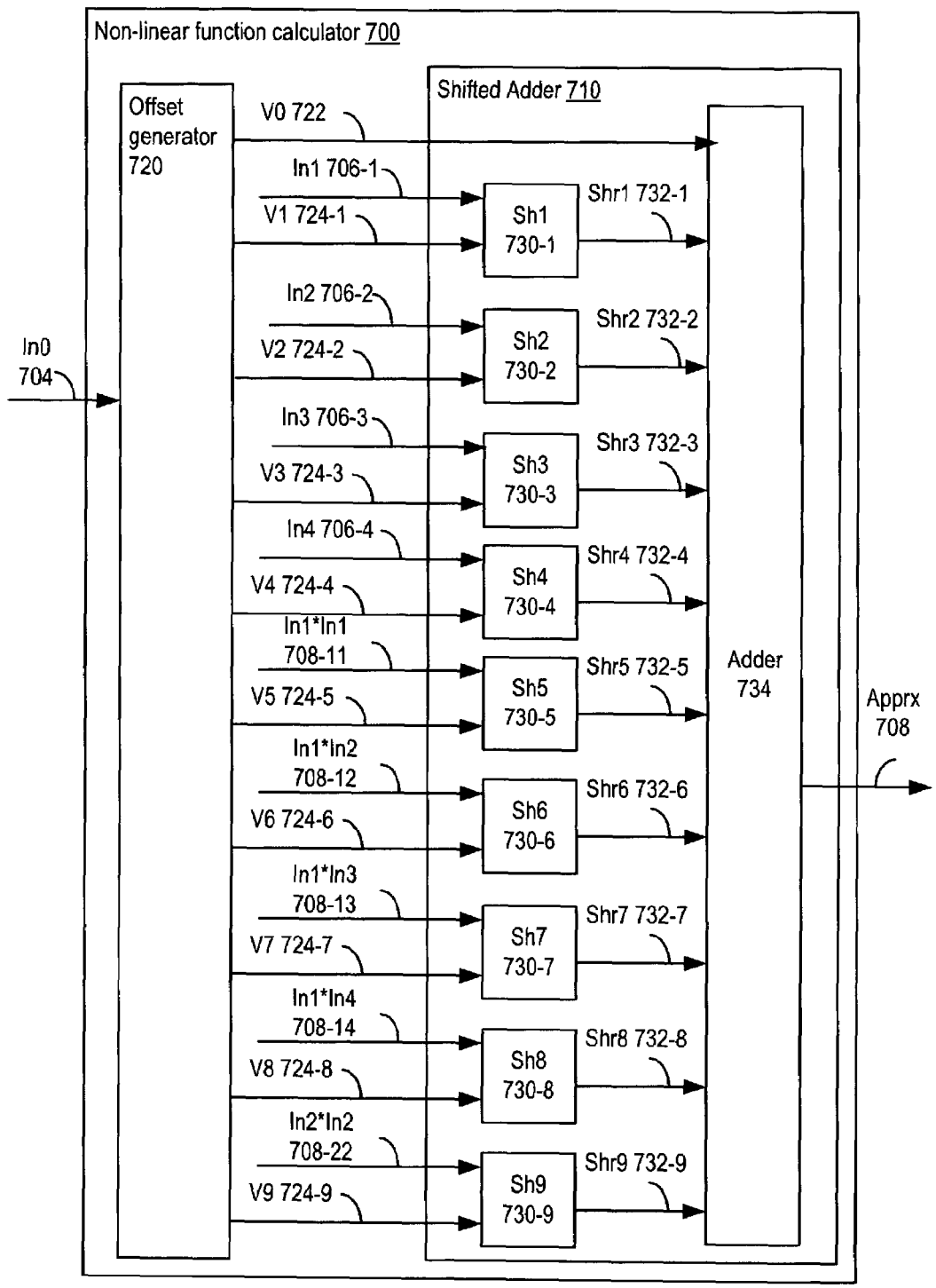
FIG. 19 illustrates a refinement of the non-linear function calculator 700 of FIG. 18A using secondary offset collection members.

FIG. 19 illustrates a refinement of the non-linear function calculator 700 of FIG. 18A using secondary offset collection member.

Figure 20A:
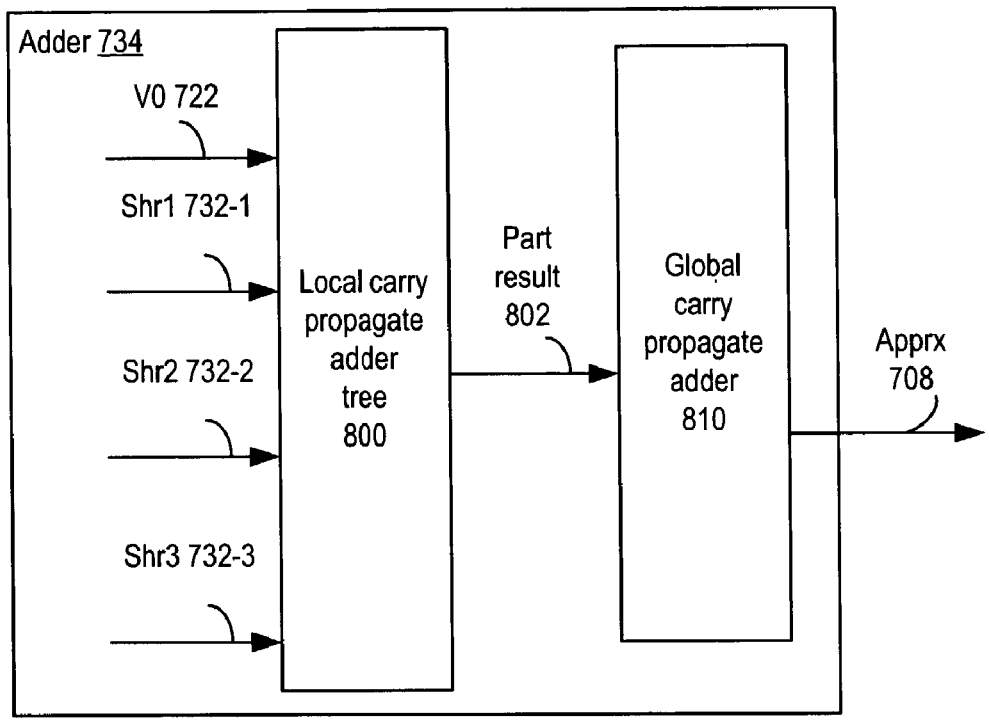
FIG. 20A illustrates a more detailed view of adder 734 of FIG. 15B using a local carry propagate adder tree 800 feeding a global carry propagate adder 810.

FIG. 20A illustrates a more detailed view of adder 734 of FIG. 15B using a local carry propagate adder tree 800 feeding a global carry propagate adder 810.

Figure 20B:
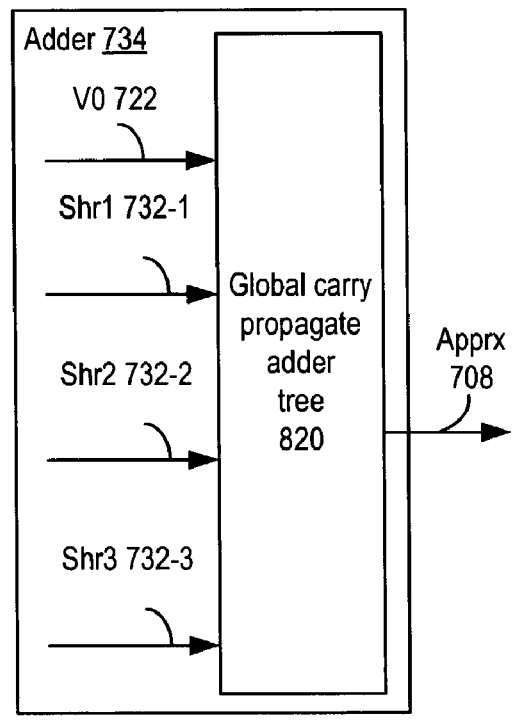
FIG. 20B illustrates a more detailed view of adder 734 of FIG. 15B using a global carry propagate adder tree 820.

FIG. 20B illustrates a more detailed view of adder 734 of FIG. 15B using a global carry propagate adder tree 820.

Figure 21A:
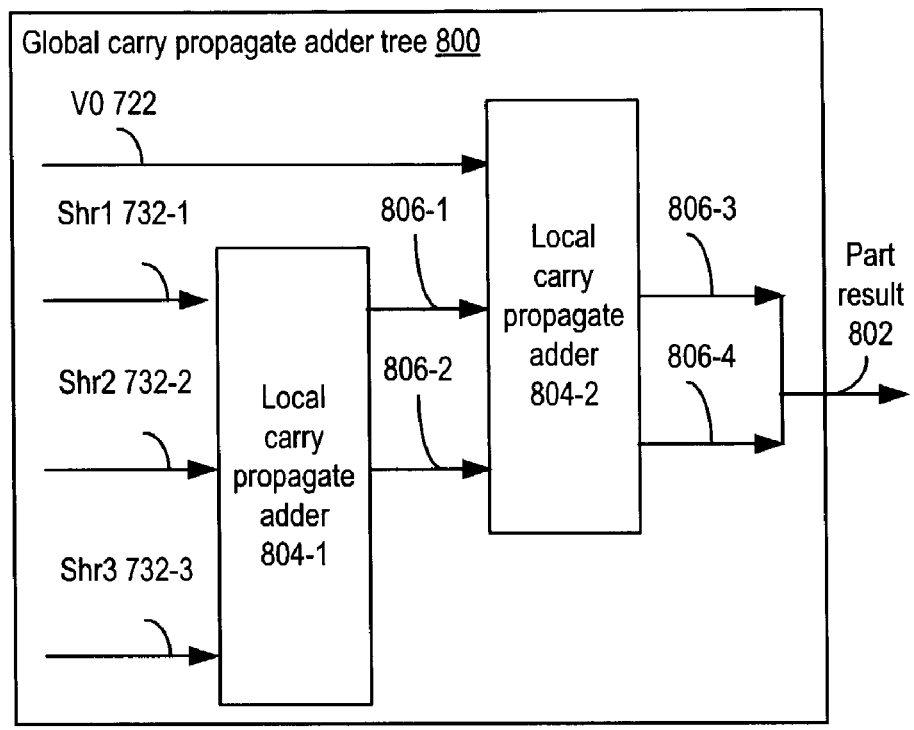
FIG. 21A illustrates a more detailed view of the local carry propagate adder tree 800 of FIG. 20A.

FIG. 21A illustrates a more detailed view of the local carry propagate adder tree 800 of FIG. 20A.

Figure 21B:
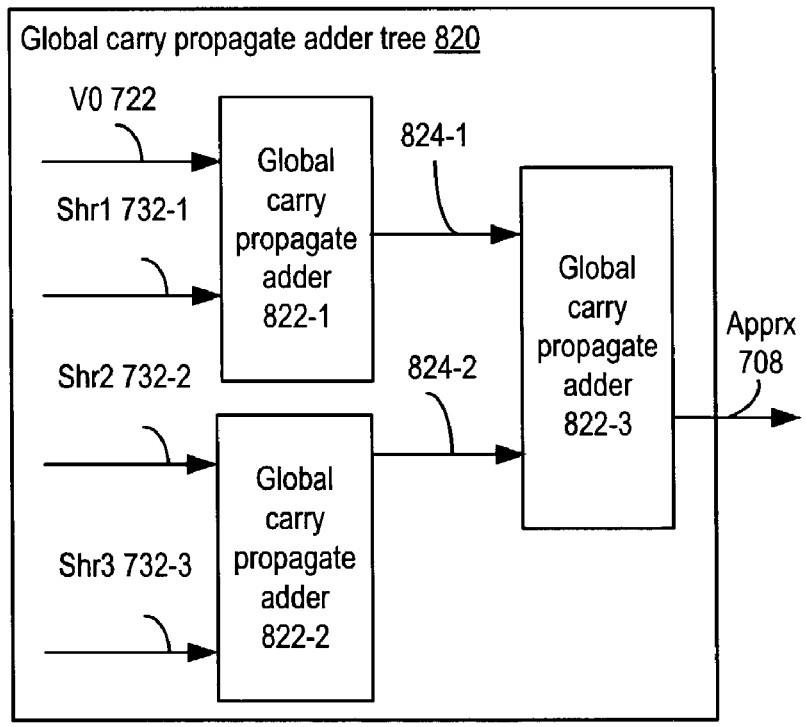
FIG. 21B illustrates a more detailed view of the global carry propagate adder tree 820 of FIG. 20B.

FIG. 21B illustrates a more detailed view of the global carry propagate adder tree 820 of FIG. 20B.

Figure 22A:
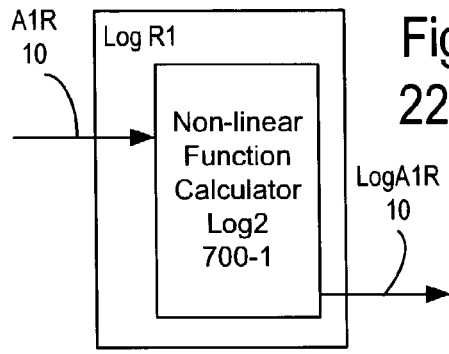
FIG. 22A illustrates a preferred embodiment of Log R1, a logarithm calculator found in FIGS. 2, 3, 4B, 6B, 12 and 14.
Figure 22B:
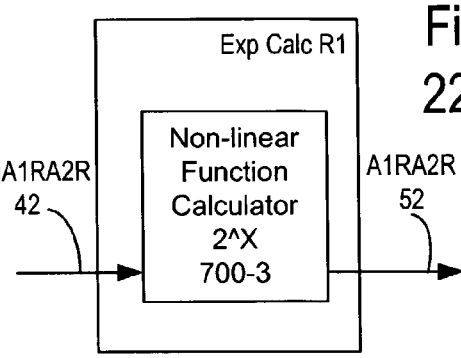
FIG. 22B illustrates a preferred embodiments of Exp Calc R1, an exponential calculator found in FIGS. 2, 3, 5A, 6B, 12 and 14.
Figure 22C:
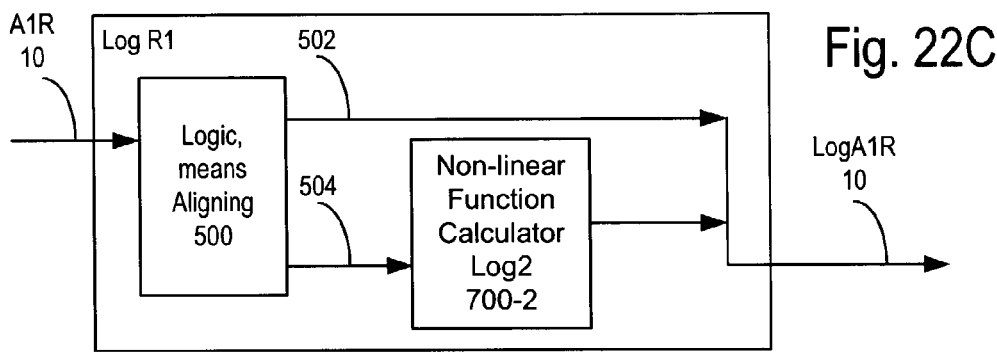
FIG. 22C illustrates a preferred embodiment of Log R1, a logarithm calculator found in FIGS. 2, 3, 4B, 6B, 12 and 14.

FIGS. 22A and 22C illustrate two preferred embodiments implementing an embodiment of Log R1, a logarithm calculator found in FIGS. 2, 3, 4B, 6B, 12 and 14.

Figure 22D:
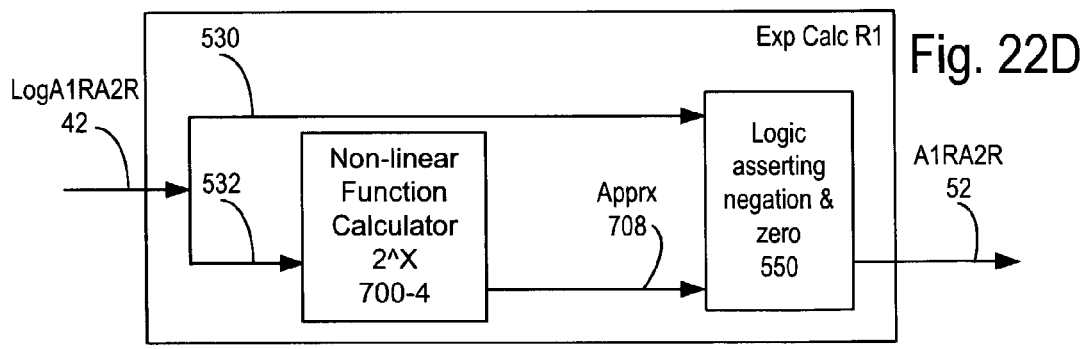
FIG. 22D illustrates a preferred embodiment of Exp Calc R1, an exponential calculator found in FIGS. 2, 3, 5A, 6B, 12 and 14.

FIGS. 22B and 22D illustrate two preferred embodiments of Exp Calc R1, an exponential calculator found in FIGS. 2, 3, 5A, 6B, 12 and 14.

Figure 22E:
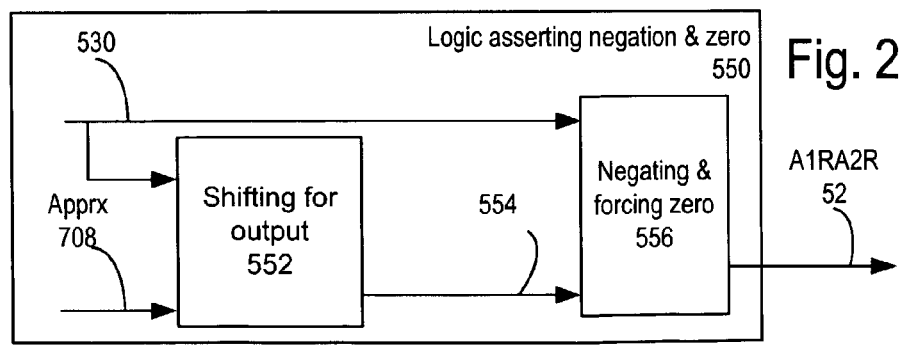
FIG. 22E illustrates a preferred refinement of the circuitry supporting the logic for asserting negation and zero 550 found in FIGS. 13C and 22D.

FIG. 22E illustrates a preferred refinement of the circuitry supporting the logic for asserting negation and zero 550 found in FIGS. 13C and 22D.

In FIGS. 15A, 18A, and 19, a shifted-input adder 710 receives a base value V0 722, an offset collection comprising an offset value V1 724-1 to V3 724-3 corresponding to each of the successive higher order fractions In1 706-1 to In3 706-3, and receiving the higher order fractions In1 706-1 to In3 706-3 to create an approximate value 708 of the non-linear function applied to the input 702. Offset generator 720 receives at least the first order fraction In0 704 to create the base value V0 722 and to create each of the offset collection members V1 724-1 to at least V3 724-3.

FIG. 18B is a refinement of FIG. 15A, further including successive higher order fraction In4 706-4, with corresponding offset collection member V4 724-4, generated by offset generator 720. The offset generator 720 further receives In1 706-1 and In2 706-2, which are used to generate at least one of the offset collection members.

FIG. 19 is a refinement of FIG. 15A, further including successive higher order fraction In4 706-4, with corresponding offset collection member V4 724-4, generated by offset generator 720. The shifted-input adder 710 further receives at least one secondary offset corresponding to at least two of the successive higher order fractions. By way of example, V5 724-5 to V9 724-9 corresponding to the pairs In1*In1, In1*In2, In1*In3, In1*In4, and In2*In2.

In FIGS. 15B, and 19, illustrate two embodiments of shifted adders 710. FIG. 15B illustrates a shifted adder 710 includes a shift-converter Sh1 730-1 to Sh3 730-3 receiving the successive higher order fraction In1 706-1 to In3 706-3 and the corresponding offset value V1 724-1 to V3 724-3 to create a shift-result, for each of the successive higher order fractions In1 706-1 to In3 706-3.

FIG. 19 further includes secondary-shift-converters Sh5 730-5 to Sh5 730-9 receiving the secondary offset collection member V5 724-5 to V9 724-9 and each of the successive higher order fractions corresponding to the pairs In1*In1, In1*In2, In1*In3, In1*In4, and In2*In2 to create a secondary-shift-result Shr5 732-5 to Shr5 732-9. Note that the secondary shift converters Shr5 732-5 to Shr5 732-9 are acting on at least twice the control data as the shift converters Shr1 732-1 to Shr4 732-4.

It is often preferred that for at least one of the successive higher order fractions, the successive higher order fraction has values exactly spanning the set of exactly four elements. It is further the case that it is often preferred if all of the successive higher order fractions span a set of four elements.

In such situations, a shift-converter may include any of the following.

The shift-converter performing a down-shift two bit multiplication of the successive higher order fraction and the corresponding offset value to create the shift-result.

The shift-converter performing an offset down-shift two bit multiplication of the successive higher order fraction and the corresponding offset value to create the shift-result.

The shift-converter performing a multiplication of the successive higher order fraction and the corresponding offset value to create the shift-result.

As used herein, down shift two bit multiplication creates the shift result as one of zero, the corresponding value shifted down one bit, the corresponding value, and the one and a half times the corresponding value.

As used herein, offset down shift two bit multiplication creates the shift result as one of a negation of the corresponding value shifted down one bit, zero, the corresponding value shifted down one bit, and the corresponding value.

There are numerical analytic reasons to prefer the first two down shifting multiplication schemes, in that the precision of the result is never diminished. In certain logic design situations, it is preferred to use the down-shift two bit multiplication over the offset down-shift two bit multiplication in that the logic required in the shifted adder 710 can be minimized due to never having to sign propagate a small offset value to the height of the base value, which tends to be several bits larger the offset value.

However, in implementations based around existing programmable logic and reconfigurable arithmetic resource circuits, standard two bit multiplications are often preferred.

Secondary shift converters preferably implement a concatenated multiplication scheme using the number of bits of their successive higher order fractions to implement one of these schemes. Concatenating the offset down shift two bit multiplication schemes result in needing only one input to adder 734, which may be preferred in some situations to concatenating down shift two bit multiplication schemes, which require four inputs to adder 734, or else requires adding the four inputs within the secondary shifted converter.

Note that in certain preferred implementations of circuits such as FIG. 19, there may be a combination of down shifted two bit multiplications implemented in Sh1 730-1 to Sh4 730-4 and concatenated, offset down-shift two bit multiplications implemented in Sh5 730-5 to Sh9 730-9.

In FIGS. 16A, 16B, 16C, 16D, 17A, 17B, and 18B, implement various offset generators of the invention.

Figure 16A:
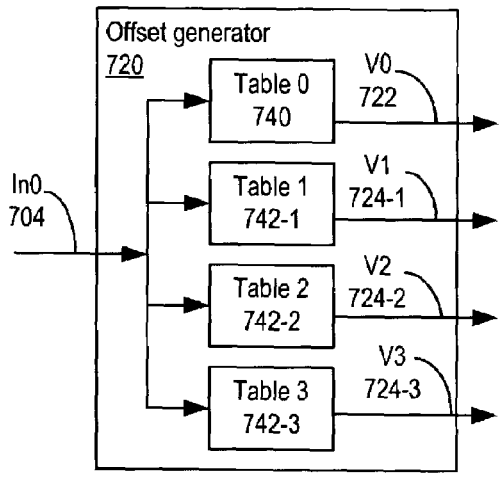
FIGS. 16A to 17B illustrates a variety of embodiments of offset generator 720 of FIG. 15A.

In FIG. 16A, the offset generator 720 includes a collection of tables 740, 742-1 to 742-3, each receiving the first order fraction In0 704 to create each of the value collection member V0 722, and V1 724-1 to V3 724-3.

Figure 16B:
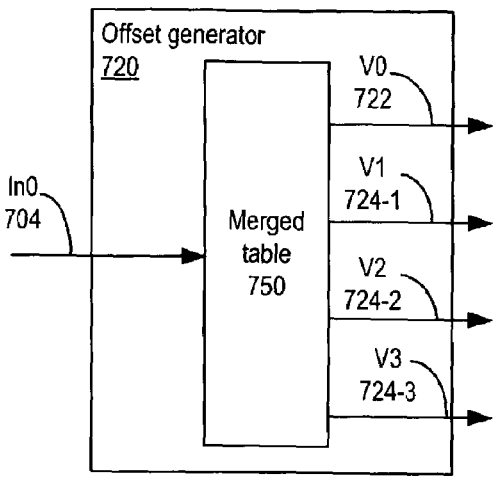

In FIG. 16B, the offset generator 720 includes a merged table 750 receiving the first order fraction In0 704 to create each of the value collection members V0 722, and V1 724-1 to V3 724-3. The offset generator may be preferred in situations when the physical alignment of corresponding bit of the V0 722, and V1 724-1 to V3 724-3 is advantageous.

Figure 16C:
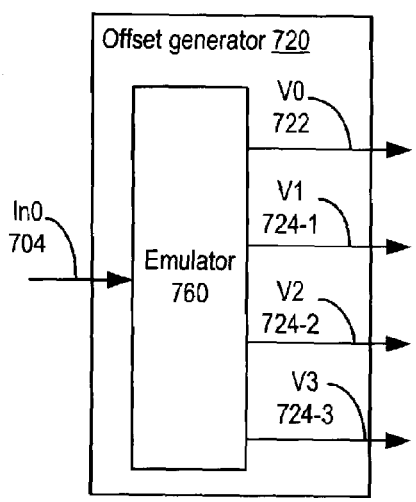

In FIG. 16C, the offset generator 720 includes a combinatorial logic network 760, emulating one the merged table 750 of FIG. 16B and the table collection 740, 742-1 to 742-3, of FIG. 16B, by receiving the first order fraction In0 704 to create each of the value collection members V0 722, and V1 724-1 to V3 724-3.

Figure 16D:
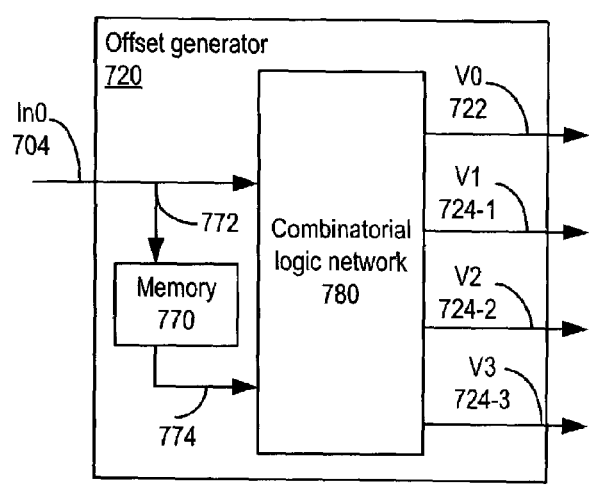

In FIG. 16D, the offset generator 720 includes a a circuit including a memory 770 receiving at least part 772 of the first order fraction In0 704 to generate a memory value 774 and a second combinatorial logic network 708 receiving at least one of at least part of the first order fraction In0 704 and the memory value 774, to create each of the value collection members V0 722, and V1 724-1 to V3 724-3.

Figure 17A:
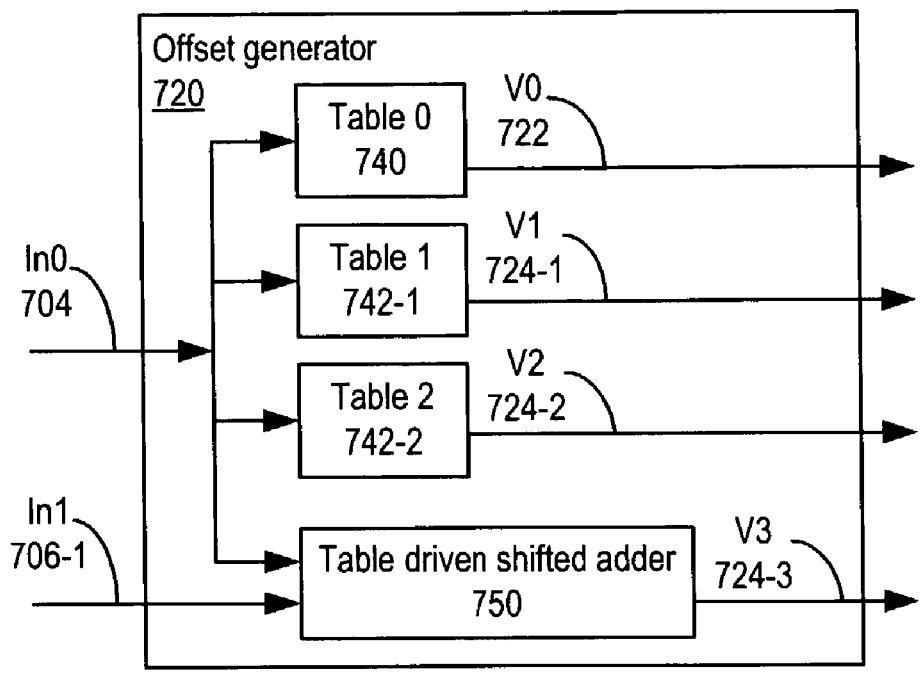

In FIG. 17A, the offset generator 720 includes a table driven shifted adder 750-3 receiving the first order fraction In0 704 and at least one of the received higher order fractions In1 706-1 to create one of the value collection members V3 723-3.

Figure 17B:
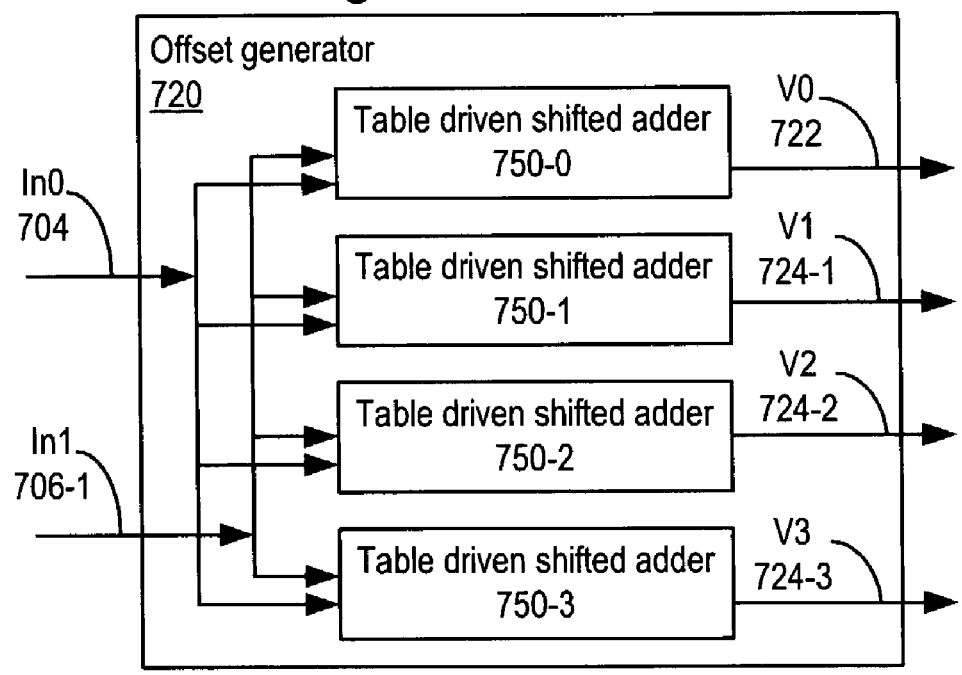

In FIG. 17B, the offset generator 720 includes a table driven shifted adder 750-0 to 750-3 receiving the first order fraction In0 704 and at least one of the received higher order fractions In1 706-1 to create each of the value collection members V0 722, and V1 724-1 to V3 724-3.

In FIG. 18A, four higher order factions In1 706-1 to In4 706-4 feed shifted adder 710. Offset generator 720 additionally receives In2 706-2 and additionally generates V4 724-4.

In FIG. 18B, an offset generator 720 for FIG. 18A, is similar to FIG. 17B, except that a second table driven shifted adder 750-2 receives the first order fraction In0 704 and all of the received higher order fractions In1 706-1 and In2 706-2 to create one of the value collection members, V2 724-2.

FIG. 20A to 20D illustrate alternative detailed views of adder 734 of FIG. 15B using local carry propagate adders and global carry propagate adders.

Each of the local carry propagate adders implements a local carry propagating addition scheme. Each of the global carry propagate adders implements a global carry propagating addition scheme.

The inventors tend to prefer carry save adders built from full adder cells in implementing local carry propagate adders. Such local carry propagate adders receive three inputs and generate two redundant numeric outputs as illustrated in FIG. 21A. Some other local carry propagating addition schemes may receive four numeric inputs and generate two numeric outputs.

The inventors tend to prefer carry look ahead adders in implementing global carry propagating addition schemes. However, many other global carry propagating addition schemes may be preferred in other circumstances, including, but not limited to, ripple carry, carry completion, carry skip, conditional sum and carry selection addition schemes.

The preceding embodiments of the invention have been provided by way of example and are not meant to constrain the scope of the following claims.

In the claims:

1. A complex multiplier providing a complex product of a first complex input, includes a first component input collection comprising an A1R and an A1I, and a second complex number defined by a LogA2R and an LogA2I, comprising:

a collection of logarithm calculators, receiving said first complex input to create a first complex log version number;

a collection of adders, adding said first complex log version number to said LogA2R to create a LogA1RA2R and a LogA1IA2R while adding said first complex log version number to said LogA2I to create a LogA1IA2I and a LogA1RA2I;

a collection of exponential calculators, exponentiating each member of a complex log component collection to create a corresponding member of a complex numeric component collection; and wherein said complex log component collection includes said LogA1RA2R and said LogA1IA2I, said LogA1IA2R and said LogA1RA2I;

wherein said complex numeric component collection includes an A1RA2R, an A1IA2I, an A1IA2R, and an A1RA2I;

wherein said complex product includes an A12R and an A12I;

wherein said first complex log version number includes a LogA1R and a LogA1I;

wherein whenever said A1R equals zero, said A1RA2R equals said zero and said A1RA2I equals said zero, further comprising:

wherein whenever said A1R equals zero, said LogA1R indicates negative infinity;

wherein whenever said LogA1R indicates said negative infinity, said LogA1RA2R indicates said negative infinity and said LogA1RA2I indicates said negative infinity;

wherein whenever said LogA1RA2R indicates said negative infinity, said A1RA2R equals zero; and wherein whenever said LogA1RA2I indicates said negative infinity, said A1RA2I equals zero;

wherein whenever said A1I equals said zero, said A1IA2R equals said zero and said A1IA2R equals said zero, further comprising:

wherein whenever said A1I equals zero, said LogA1I indicates said negative infinity;

wherein whenever said LogA1I indicates said negative infinity, said LogA1IA2R indicates said negative infinity and said LogA1IA2I indicates said negative infinity;

wherein whenever said LogA1IA2R indicates said negative infinity, said A1IA2R equals zero; and wherein whenever said LogA1IA2I indicates said negative infinity, said A1IA2I equals zero.

19

2. The complex multiplier of claim 1, further comprising:
circuitry providing at least one member of a log-value collection; and
wherein said log-value collection is comprised of said Log A1R, said Log A1I, said Log A1RA2R, said Log A1IA2I, said Log A1IA2R, and said Log A1RA2I.

3. The complex multiplier of claim 2,
wherein said circuitry providing said log-value collection member is comprised of at least one member of the collection comprising:
circuitry providing said Log A1R;
circuitry providing said Log A1I;
circuitry providing said Log A1RA2R;
circuitry providing said Log A1IA21;
circuitry providing said Log A1IA2R; and
circuitry providing said Log A1RA2I.

4. The complex multiplier of claim 1, further comprising at least one member of the collection comprising, for each of said complex numeric component collection members:
circuitry providing said complex numeric component collection member.

5. The complex multiplier of claim 4, further comprising:
circuitry providing said complex numeric component collection member, for each of said complex numeric component collection members;
circuitry providing said Log A1R; and
circuitry providing said Log A1I.

6. An apparatus acting as an FFT radix engine for performing at least an FFT radix operation based upon said first complex input of claim 1, comprising:
said complex multiplier providing said complex product using said Log A2R and said Log A2I to define said second complex input; and said apparatus further comprising, for each of at least two current complex values, of:
circuitry creating a previously presented complex value based upon said current complex value, a control for said current complex value, said complex input, and said complex product.

7. The apparatus of claim 6,
wherein said complex multiplier is further comprised of:
circuitry providing at least one member of a log-value collection;
wherein said log-value collection is comprised of said Log A1R, said Log A1I, said Log A1RA2R, said Log A1IA2I, said Log A1IA2R, and said Log A1RA2I;
wherein said circuitry creating at least one of said previously presented complex values is further comprised of:
means for creating at least a component of said current complex value based upon said current complex value, said control, said complex input, said complex product and said provided log-value collection member.

8. The apparatus of claim 6, wherein said FFT radix operation includes at least an FFT Radix 2 operation.

9. The apparatus of claim 6,
wherein said FFT radix operation includes at least an FFT Radix 4 operation; and
wherein said circuitry receiving said current complex values is further comprised of:
said circuitry receiving at least four of said current complex values.

10. The apparatus of claim 6,
wherein said FFT radix operation includes at least an FFT Radix 8 operation; and said apparatus is further comprised of:

20 circuitry calculating a second complex product based upon at least one member of the collection comprising said first complex input and said complex product;
wherein said circuitry receiving said current complex values is further comprised of:
said circuitry receiving at least eight of said current complex values;
wherein for each of said current complex values, said circuitry creating said previously presented complex value is further comprised of:
said circuitry creating said current complex value based upon said control, said complex input, and at least one member of the collection comprising said complex product and said second complex product.

11. The apparatus of claim 10,
wherein said circuitry calculating said second complex product is further comprised of at least one member of the collection comprising:
circuitry calculating said second complex product as a multiple of said complex product; and
a second of said complex multipliers providing said second complex product from said complex input.

12. The apparatus of claim 11,
wherein said circuitry calculating said second complex product as said multiple is comprised of a member of the collection comprising:
said circuitry calculating a fixed multiple of said complex product to create said second complex product; and
a third of said complex multipliers receiving said complex input as said complex product and said second complex input approximating said fixed multiple.

13. The apparatus of claim 6, wherein said circuitry creating said previously presented complex value, is further comprised of:
said circuit creating said previously presented complex value based upon said A1RA2R, said A1IA2I, said A1IA2R, and said A1RA2I.

14. The apparatus of claim 1, further comprising a member of the collection comprising:
a second of said logarithm calculator collections, receiving said second complex input to create said Log A2R and said Log A2I; and
an input generator providing said Log A2R and said Log A2I.

15. The complex multiplier of claim 1, wherein said exponential calculator collection is comprised of:
a first member, calculating an exponentiation of an input as said Log A1RA2R to create said A1RA2R;
a second member, calculating said exponentiation of said input as said Log A1IA2I to create said A1IA2I;
a third member, calculating said exponentiation of said input as said Log A1IA2R to create said A1IA2R; and
a fourth member, calculating said exponentiation of said input as said Log A1RA2I to create said A1RA2I.

16. The complex multiplier of claim 15,
wherein at least one of said exponential calculator collection members, is comprised of at least one member of an exponential calculator component collection comprising: a table, an arithmetic circuit fed by said table, a logic circuit operating upon an output of said arithmetic circuit to establish at least negation and zero for said exponentiation;
wherein said table is implemented as at least one member of a collection comprising a memory, a combinatorial logic network, and a second combinatorial logic network feed by at least one members of the collection including said memory and said combinatorial logic network.

17. The complex multiplier of claim 15,
wherein at least one of said exponential calculator collection members, is further comprised of:
said member, calculating said exponentiation of said input as a member of a non-log-value collection;
wherein said non-log-value collection is comprised of the members of said complex numeric component, and the members of said first component input collection, said A12R, and said A12I.

18. The complex multiplier of claim 1, wherein said collection of logarithm calculators, receiving said first complex input is further comprised of:
a first member, calculating a logarithm of said A1R to create said Log A1R; and
a second member, calculating a logarithm of said A1I to create said Log A1I.

19. The complex multiplier of claim 18,
wherein at least one of said logarithm calculator members is comprised of at least one member of a logarithm calculator component collection comprising: a logic circuit aligning said component input to access a table and drive an arithmetic circuit fed by said table;
wherein said table is implemented as at least one member of a collection comprising a memory, a combinatorial logic network, and a second combinatorial logic network feed by at least one member of the collection including said memory and said combinatorial logic network.

20. The complex multiplier of claim 1, further comprising: a second collection of adders, creating said complex product from said complex numeric component collection.

21. The complex multiplier of claim 20, wherein said second adder collection, creating said complex product is further comprised of:
a first member, subtracting said A1IA2I from said A1RA2R to create said A12R; and
a second member, adding said A1IA2R to said A1RA2I to create said A12I.

22. The complex multiplier of claim 1, wherein each member of said complex numeric component collection represents a floating point number.

23. An apparatus providing a complex product of a first complex input and a second complex number defined by a Log A2R and an Log A2I;
wherein said first complex input includes a first component input collection comprising an A1R and an A1I;
wherein said first complex log version number includes a Log A1R and a Log A1I;
wherein said apparatus, comprising:
means for receiving said first complex input to create a first complex log version number, further comprising:
means for whenever said A1R equals zero, said Log A1R indicates negative infinity; and
means for whenever said A1I equals zero, said Log A1I indicates negative infinity;
means for adding said first complex log version number to said Log A2R of said second complex number to create a Log A1RA2R and a Log A1IA2I while adding said first complex log version number to said Log A2I of said second complex number to create a Log A1IA2R and a Log A1RA2I, further comprising:

means for whenever said Log A1R indicates said negative infinity, said Log A1RA2R indicates said negative infinity and said Log A1RA2I indicates said negative infinity; and
means for whenever said Log A1I indicates said negative infinity, said Log A1IA2R indicates said negative infinity and said Log A1IA2I indicates said negative infinity;
means for exponentiating each of member of a complex log component collection to create a corresponding member of a complex numeric component collection including an A1RA2R, an A1IA2I, an A1IA2R, and an A1RA2I, comprising:
means for whenever said Log A1RA2R indicates said negative infinity, said A1RA2R equals zero;
means for whenever said Log A1RA2I indicates said negative infinity, said A1RA2I equals zero;
means for whenever said Log A1IA2R indicates said negative infinity, said A1IA2R equals zero; and
means for whenever said Log A1IA2I indicates said negative infinity, said A1IA2I equals zero;
wherein said complex product includes an A12R and an A12I;
wherein said A12R equals said A1RA2R minus said A1IA2I; and
wherein said A12I equals said A1IA2R plus said A1RA2I.

24. The apparatus of claim 23, further comprising:
means for creating said complex product is further comprised of:
means for subtracting said A1IA2I from said A1RA2R to create said A12R; and
means for adding said A1IA2R to said A1RA2I to create said A12I.

25. The apparatus of claim 23,
wherein the means for receiving said first complex input is further comprised of:
means for calculating a logarithm of said A1R to create said Log A1R; and
means for calculating a logarithm of said A1I to create said Log A1I.

26. The apparatus of claim 25,
wherein at least one of the means for calculating said logarithm is comprised of at least one member of a logarithm calculator component collection comprising:
a logic circuit aligning said component input to access a table and drive an arithmetic circuit fed by said table;
wherein said table is implemented as at least one member of a collection comprising a memory, a combinatorial logic network, and a second combinatorial logic network feed by at least one member of the collection including said memory and said combinatorial logic network.

27. The apparatus of claim 25,
wherein the means for calculating said logarithm of said A1R to create said Log A1R, further comprises:
means for whenever said A1R equals zero, said Log A1R indicates negative infinity;
wherein the means for calculating said logarithm of said A1I to create said Log A 11, further comprises:
means for whenever said A1I equals zero, said Log A1I indicates negative infinity.

28. The apparatus of claim 23,
wherein the means for exponentiating is further comprised of:
means for calculating an exponentiation of an input as said Log A1RA2R to create said A1RA2R;

means for calculating said exponentiation of said input as said Log A1IA2I to create said A1IA2I;
means for calculating said exponentiation of said input as said Log A1IA2R to create said A1IA2R; and
means for calculating said exponentiation of said input as said Log A1RA2I to create said A1RA2I.

29. The apparatus of claim 28,
wherein at least one of the means for calculating said exponentiation is comprised of at least one member of an exponential calculator component collection comprising: a table, an arithmetic circuit fed by said table, a logic circuit operating upon an output of said arithmetic circuit to establish at least negation and zero for said exponentiation;
wherein said table is implemented as at least one member of a collection comprising a memory, a combinatorial logic network, and a second combinatorial logic network fed by at least one member of the collection including said memory and said combinatorial logic network.

30. The apparatus of claim 28,
wherein at least one of the means for calculating said exponentiation is further comprised of:
means for calculating said exponentiation of said input as a member of a non-log-value collection;
wherein said non-log-value collection is comprised of the members of said complex numeric component, and the members of said first component input collection, said A12R, and said A12I.

31. The apparatus of claim 28,
wherein the means for calculating said exponentiation of said input as said Log A1RA2R to create said A1RA2R, further comprises:
means for whenever said Log A1RA2R indicates said negative infinity, said A1RA2R equals zero;
wherein the means for calculating said exponentiation of said input as said Log A1IA2I to create said A1IA2I, further comprises:
means for whenever said Log A1IA2I indicates said negative infinity, said A1IA2I equals zero;
wherein the means for calculating said exponentiation of said input as said Log A1IA2R to create said A1IA2R, further comprises:
means for whenever said Log A1IA2R indicates said negative infinity, said A1IA2R equals zero; and
wherein the means for calculating said exponentiation of said input as said Log A1RA2I to create said A1RA2I, further comprises:
means for whenever said Log A1RA2I indicates said negative infinity, said A1RA2I equals zero.

32. The apparatus of claim 23, further comprising:
means for providing at least one member of a log-value collection; and
wherein said log-value collection is comprised of said Log A1R, said Log A1I, said Log A1RA2R, said Log A1IA2I, said Log A1IA2R, and said Log A1RA2I.

33. The apparatus of claim 32,
wherein the means for providing said log-value collection member is comprised of at least one member of the collection comprising:
means for providing said Log A1R;
means for providing said Log A1I;
means for providing said Log A1RA2R;
means for providing said Log A1IA2I;
means for providing said Log A1IA2R; and
means for providing said Log A1RA2I.

34. The apparatus of claim 23, further comprising at least one member of the collection comprising, for each of said complex numeric component collection members:
means for providing said complex numeric component collection member.

35. The apparatus of claim 34, further comprising:
means for providing said complex numeric component collection member, for each of said complex numeric component collection members;
means for providing said Log A1R; and
means for providing said Log A1I.

36. An FFT radix engine for performing at least an FFT radix operation based upon said first complex input of claim 23, comprising:
the means of providing said complex product using said Log A2R and said imaginary plane-log-version to define said second complex input:
means for receiving at least two current complex values; and, said apparatus further comprising, for each of said current complex values, of:
means for receiving a control for said current complex value; and
means for creating a previously presented complex value based upon said current complex value, said control, said complex input, and said complex product.

37. The apparatus of claim 36,
wherein said means providing said complex product is further comprised of:
means for providing at least one member of a log-value collection;
wherein said log-value collection is comprised of said Log A1R, said Log A1I, said Log A1RA2R, said Log A1IA2I, said Log A1IA2R, and said Log A1RA2I;
wherein the means for creating at least one of said previously presented complex values is further comprised of:
means for creating at least a component of said current complex value based upon said current complex value, said control, said complex input, said complex product and said provided log-value collection member.

38. The apparatus of claim 36, wherein said FFT radix operation includes at least an FFT Radix 2 operation.

39. The apparatus of claim 36,
wherein said FFT radix operation includes at least an FFT Radix 4 operation; and
wherein the means for receiving said current complex values is further comprised of:
means for receiving at least four of said current complex values.

40. The apparatus of claim 36,
wherein said FFT radix operation includes at least an FFT Radix 8 operation; and said apparatus is further comprised of:
means for calculating a second complex product based upon at least one member of the collection comprising said first complex input and said complex product;
wherein the means for receiving said current complex values is further comprised of:
means for receiving at least eight of said current complex values;
wherein for each of said current complex values, the means for creating said previously presented complex value is further comprised of:
means for creating said current complex value based upon said control, said complex input, and at least one member of the collection comprising said complex product and said second complex product.

41. The apparatus of claim 40,
wherein the means for calculating said second complex product is further comprised of at least one member of the collection comprising:
means for calculating said second complex product as a multiple of said complex product; and
a second of said means of claim 23 providing said second complex product from said complex input.

42. The apparatus of claim 41,
wherein the means for calculating said second complex product as said multiple is comprised of a member of the collection comprising:
means for calculating a fixed multiple of said complex product to create said second complex product; and
a third of said means of claim 23 receiving said complex input as said complex product and said second complex input approximating said fixed multiple.

43. The apparatus of claim 23, further comprising a member of the collection comprising:
a second of said means for receiving said second complex input to create said Log A2R and said Log A2I; and
means for generating said Log A2R and said Log A2I.

* * * * *